United States Patent
Liu et al.

(10) Patent No.: US 7,384,808 B2
(45) Date of Patent: Jun. 10, 2008

(54) FABRICATION METHOD OF HIGH-BRIGHTNESS LIGHT EMITTING DIODE HAVING REFLECTIVE LAYER

(75) Inventors: Jin-Hsiang Liu, Taipei (TW); Hui-Heng Wang, Taoyuan (TW); Kun-Chuan Lin, Taipei (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 394 days.

(21) Appl. No.: 11/180,002

(22) Filed: Jul. 12, 2005

(65) Prior Publication Data
US 2007/0020788 A1    Jan. 25, 2007

(51) Int. Cl.
*H01L 21/00* (2006.01)
(52) U.S. Cl. ............... 438/29; 438/22; 438/45; 257/E21.016
(58) Field of Classification Search ............ 438/22, 438/29, 45, 21, 23, 46; 257/E21.016
See application file for complete search history.

(56) References Cited

U.S. PATENT DOCUMENTS

| 4,570,172 | A   |    | 2/1986  | Henry et al. ............. 357/17 |
| 5,237,581 | A   |    | 8/1993  | Asada et al. ............. 372/45 |
| 5,376,580 | A   |    | 12/1994 | Kish et al. ............. 437/127 |
| 6,420,199 | B1  | *  | 7/2002  | Coman et al. ............ 438/22 |
| 6,586,875 | B1  | *  | 7/2003  | Chen et al. ............. 313/506 |
| 6,797,987 | B2  |    | 9/2004  | Chen ................... 257/98 |
| 6,869,820 | B2  | *  | 3/2005  | Chen ................... 438/79 |
| 6,956,246 | B1  | *  | 10/2005 | Epler et al. ............. 257/94 |
| 7,015,117 | B2  | *  | 3/2006  | Urbanek ................ 438/458 |
| 2002/0105003 | A1 | * | 8/2002  | Yang et al. ............. 257/94 |
| 2003/0143772 | A1 | * | 7/2003  | Chen ................... 438/47 |
| 2004/0227148 | A1 | * | 11/2004 | Camras et al. ........... 257/99 |
| 2005/0062049 | A1 | * | 3/2005  | Lin et al. .............. 257/79 |

OTHER PUBLICATIONS

"AlGaInp light-emitting diodes with mirror substrates fabricated by wafer bonding", Applied Physics Letters, Nov. 15, 1999, vol. 75, Issue 20, pp. 3054-3056.

* cited by examiner

*Primary Examiner*—Michael S. Lebentritt
*Assistant Examiner*—Seahvosh J Nikmanesh

(57) ABSTRACT

A method for fabricating a high brightness LED structure is disclosed herein, which comprises at least the following steps. First, a first layered structure is provided by sequentially forming a light generating structure, a non-alloy ohmic contact layer, and a first metallic layer from bottom to top on a side of a first substrate. Then, a second layered structure comprising at least a second substrate is provided. Then, the two-layered structures are wafer-bonded together, with the top side of the second layered structure interfacing with the top side of said first layered structure. The first metallic layer functions as a reflective mirror, which is made of a pure metal or a metal nitride to achieve superior reflectivity, and whose reflective surface does not participate in the wafer-bonding process directly.

24 Claims, 21 Drawing Sheets

US 7,384,808 B2

FABRICATION METHOD OF HIGH-BRIGHTNESS LIGHT EMITTING DIODE HAVING REFLECTIVE LAYER

BACKGROUND OF THE INVENTION

1. Field of the Invention

The present invention generally relates to light emitting diodes, and more particularly to a fabrication method for light emitting diodes having a reflective layer to avoid light absorption by the diode's substrate.

2. The Prior Arts

FIG. 1a is a schematic sectional view showing a typical structure of a conventional light emitting diode (LED). As illustrated, the LED 100 contains a semiconductor substrate 103 and a light generating structure 102 on top of the substrate 103, and two ohmic contact electrodes 109 and 101 formed on the other side of the substrate 103 and on top of the light generating structure 102 respectively.

The light generating structure 102 is often made of layers of aluminum-bearing III-V compound semiconductors, such as AlGaAs for infrared and red lights, AlGaInP for yellow-green, yellow, amber, and red lights. The substrate 103 is usually made of gallium arsenide (GaAs) which has a matching lattice constant to that of the light generating structure 102. Lights generated by the light generating structure 102 are emitted toward all directions (i.e., isotropic). However, as the GaAs substrate 103 has an energy gap smaller than that of the visible light, a significant portion of the lights emitted by the light generating structure 102 is absorbed by the GaAs substrate 103, which significantly affects the LED 100's external quantum efficiency and, thereby, the LED 100's brightness.

FIG. 1b is a schematic sectional view showing another typical structure of a conventional LED. As illustrated, the LED 100' requires etching part of the light generating structure 102' so as to have the electrode 109' configured on the same side of the LED 100' as the electrode 101'. In addition, for the LED 100 of FIG. 1a, the substrate 103 has to be electrically conductive for the conduction of injection current between the electrodes 101 and 109, while, for the LED 100' of FIG. 1b, the substrate 103' could be electrically conductive or non-electrically conductive. Similar to the LED 100, the LED 100' still suffers the same substrate absorption problem. For ease of reference, the LED 100 of FIG. 1a is referred to as having a vertical electrode arrangement, while the LED 100' of FIG. 1b is referred to as having a planar electrode arrangement hereinafter.

Various approaches have been proposed to counter the problem of light absorption by the substrate. U.S. Pat. Nos. 4,570,172 and 5,237,581 disclose a similar light emitting diode structure as depicted in FIG. 1 except that, on top of the substrate, the light generating structure is sandwiched between a lower and an upper Distributed Bragg Reflectors (DBRs). By the configuration of the DBRs, lights emitted from the light generating structure toward the substrate are reflected and their absorption by the substrate is thereby avoided. However, the DBRs provide high reflectivity only for normal incident lights and the reflectivity decreases as the lights' incident angle increases. The improvement to the LED's external quantum efficiency and brightness is therefore limited.

U.S. Pat. No. 5,376,580 discloses another two approaches using wafer bonding processes. In one of the approaches, an LED epitaxial structure is first grown on a GaAs substrate. The LED epitaxial structure is then wafer-bonded to a transparent substrate. In the other approach, similarly, an LED epitaxial structure is first grown on a GaAs substrate. The LED epitaxial structure is then wafer-bonded to a mirror. Both approaches improve the LED's external quantum efficiency by removing the light-absorbing GaAs substrate, and letting lights either penetrate through the transparent substrate in the first approach or reflected by the mirror in the second approach. However, the problem with the approach using transparent substrate is that its wafer-bonding process requires to be operated under a high annealing temperature over an extended period of time, which would cause redistribution of doping profile and degrade the LED's performance. The problem with the approach using mirror is that the mirror's reflective surface is directly involved in the bonding interface during the wafer-bonding process, which would lead to roughness of the reflective surface or reactions and contaminations to the mirror's reflective surface.

Horng et al. discloses yet another technique in "AlGaInP light-emitting diodes with mirror substrates fabricated by wafer bonding", Applied Physics Letters, Nov. 15, 1999, Volume 75, Issue 20, pp. 3054-3056. In this technique, a Si substrate with an Au/AuBe reflector is fused to an LED epitaxial structure before removing the GaAs absorbing substrate. In general, Au/AuBe is used in AlGaInP LEDs to form ohmic contacts with p-type material. Here the Au/AuBe was used as a bonding layer and metal mirror in the wafer-bonded LED epitaxial structure. However, alloy material AuBe possesses inferior reflectivity and thereby limits the brightness improvement of the LED. The alloy process, which usually requires a high annealing temperature, would also compromise the surface flatness of the reflective mirror and degrade its reflectivity.

U.S. Pat. No. 6,797,987 discloses a light emitting diode also using a reflective metal layer. In the disclosed structure, in order to prevent the reflective metal layer from reacting with the light generating structure during the wafer bonding process, a transparent electrically conductive oxide layer such as ITO is interposed therebetween. To improve the ohmic contact between the ITO layer and the light generating structure, the disclosed structure proposes forming ohmic contact grid pattern or channels in the ITO layer, or forming an alloy metal mesh between the ITO layer and the light generating structure. The disclosed structure has rather complicated fabrication process, and therefore a high production cost. The alloy metal mesh requires a high temperature alloy process, and etching the alloy metal to form mesh is also very difficult to control. In addition, the thickness of the alloy metal requires special attention. If the alloy metal is too thin, the ohmic contact between the alloy metal and the light generating structure is inferior; if the alloy metal is too thick, the wafer bonding process couldn't achieve a strong bonding.

SUMMARY OF THE INVENTION

The major objective of the present invention therefore is to provide a fabrication method for a high brightness LED structure which obviates the foregoing shortcomings in resolving the substrate absorption problem.

The high brightness LED structure fabricated according to the present invention comprises at least a light generating structure and, on a side of the light generating structure and sequentially arranged in the following order, a non-alloy ohmic contact layer, a first metallic layer, and a substrate. The foregoing LED structure, after its formation, is then put through a chip process which involves forming the electrodes and other relevant tasks in order to manufacture LED chips from the LED structure.

To form the foregoing LED structure, the present invention comprises at least the following steps. First, a first layered structure is provided by sequentially forming a light generating structure, a non-alloy ohmic contact layer, and a first metallic layer from bottom to top on a side of a first substrate. Then, a second layered structure comprising at least a second substrate is provided. Then, the two-layered structures are wafer-bonded together, with the top side of the second layered structure interfacing with the top side of said first layered structure.

A significant characteristic of the present invention lies in the deposition of the non-alloy ohmic contact layer and the first metallic layer in resolving the substrate absorption problem. The first metallic layer functions as a reflective mirror and is made of a pure metal or a metal nitride for superior reflectivity. The non-alloy ohmic contact layer is interposed between the light generating structure and the first metallic layer so as to achieve the required low resistance electrical conduction. To prevent the first metallic layer from intermixing with the non-alloy ohmic contact layer and the light generating structure, and to maintain the flatness of the reflective surface of the first metallic layer, the present invention farther comprises a step to interpose an optically transparent and electrically conductive first dielectric layer between the first metallic layer and the non-alloy ohmic contact layer.

Another significant characteristic of the present invention lies in that the reflective surface of the reflective mirror (i.e., the first metallic layer) does not directly participate in the wafer-bonding process. The first metallic layer is directly coated to the light generating structure in vacuum during the preparation of the first layered structure and it is the bottom surface of the first metallic layer involving in the subsequent wafer-bonding process. Therefore, the exposure to the air, the high annealing temperature and pressure of the wafer-bonding process would not cause contamination to the reflective surface of the first metallic layer and thereby compromise the surface flatness and reflectivity of the first metallic layer. To achieve superior bonding between the second substrate and the first metallic layer, the present invention could further comprise a step of depositing at least an additional metallic layer beneath the first metallic layer, or on top of the second substrate, or both, to function as a bonding agent. Similarly, if the additional metallic layer is formed beneath the first metallic layer, to prevent it from intermixing with the first metallic layer and thereby compromising the reflectivity of the first metallic layer, the present invention could interpose a second dielectric layer between the first metallic layers and the additional metallic layer.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

The following descriptions are exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

The present invention generally comprises at least the following steps. First, a first layered structure is provided by sequentially forming a light generating structure, a non-alloy ohmic contact layer, and a first metallic layer from bottom to top on a side of a first substrate. Then, a second layered structure comprising at least a second substrate is provided. Then, the two-layered structures are wafer-bonded together, with the top side of the second layered structure interfacing with the top side of said first layered structure. It is also possible to form the second layered structure prior to the formation of the first layered structure. The order of forming the first and the second layered structures is of no relevance.

Figure 1A:
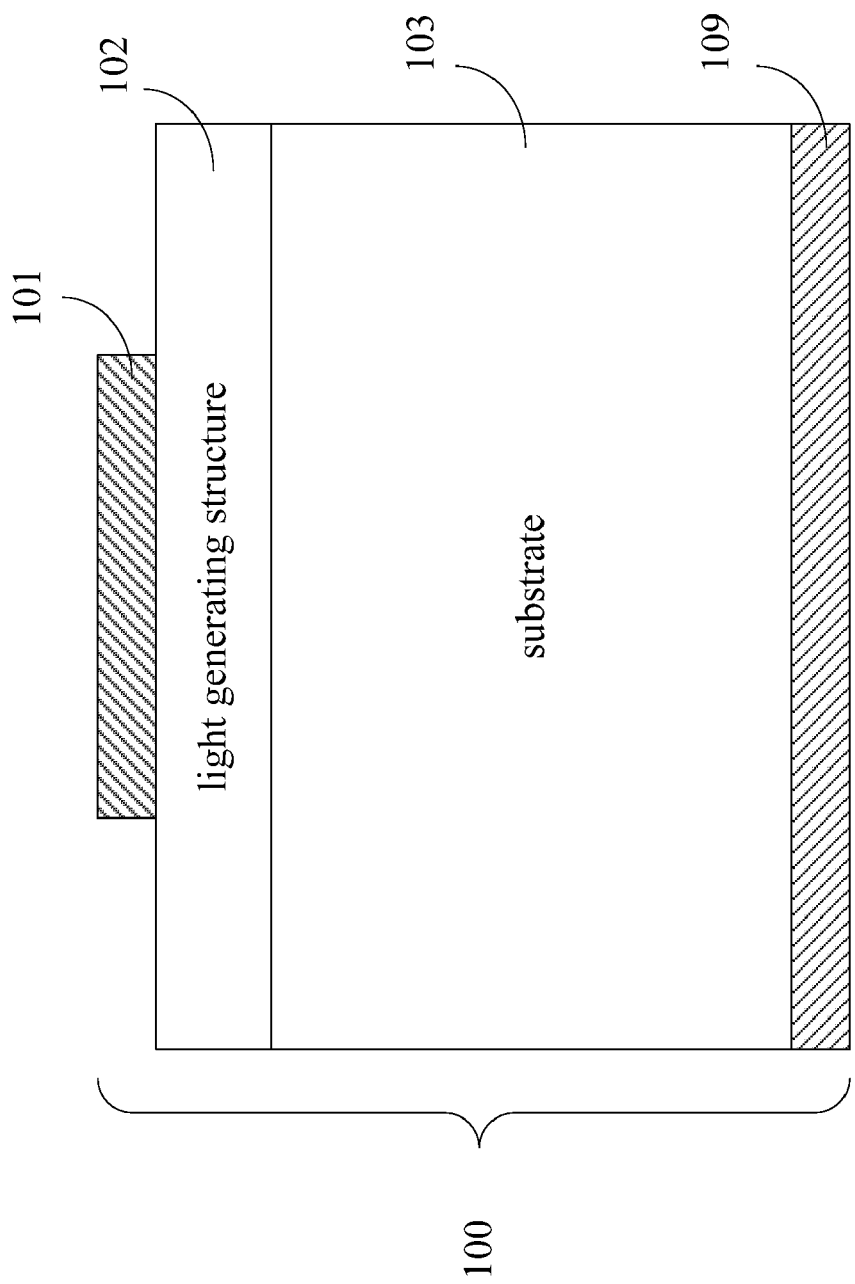
FIG. 1a is a schematic sectional view showing a typical structure of a conventional LED.
Figure 1B:
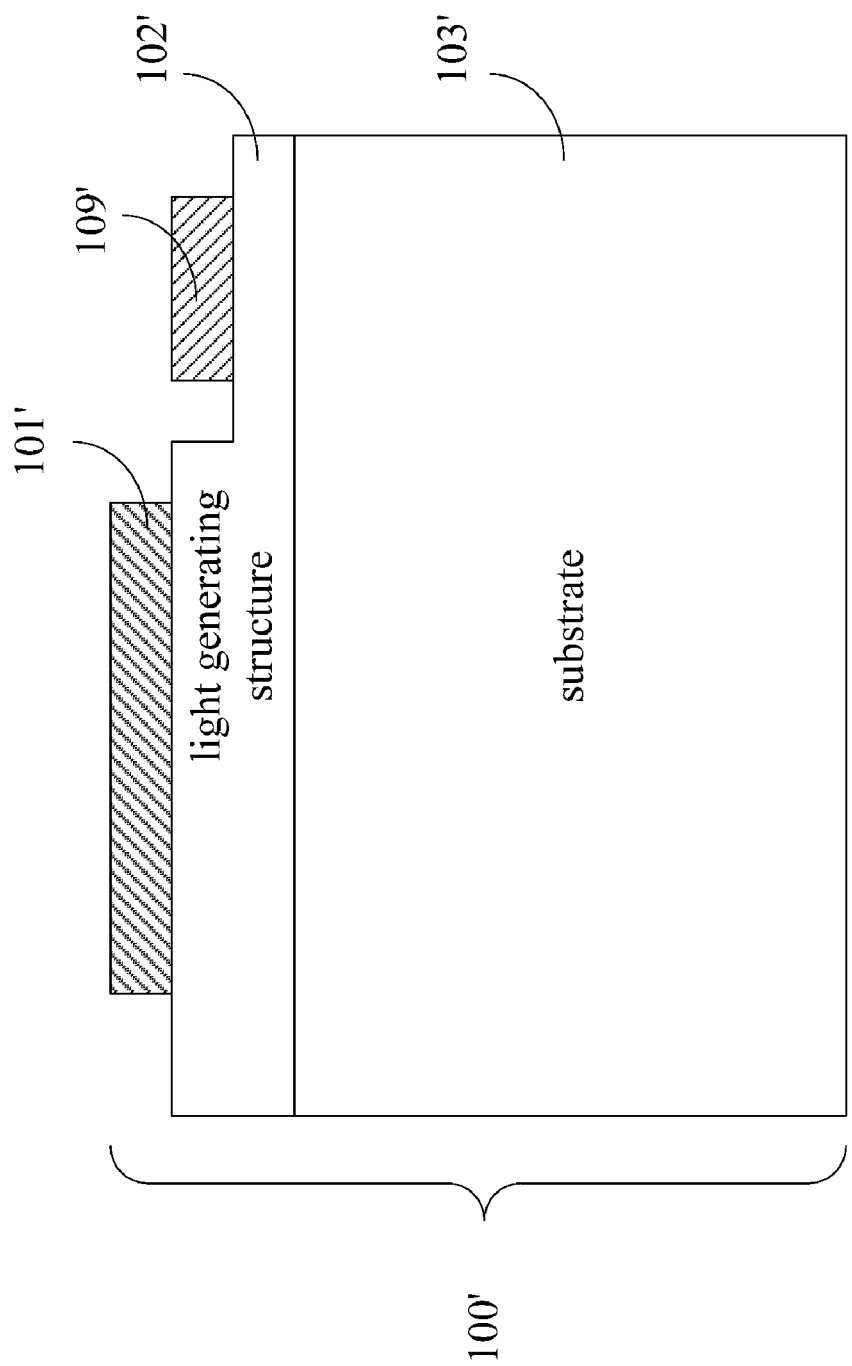
FIG. 1b is a schematic sectional view showing another typical structure of a conventional LED.
Figure 2A:
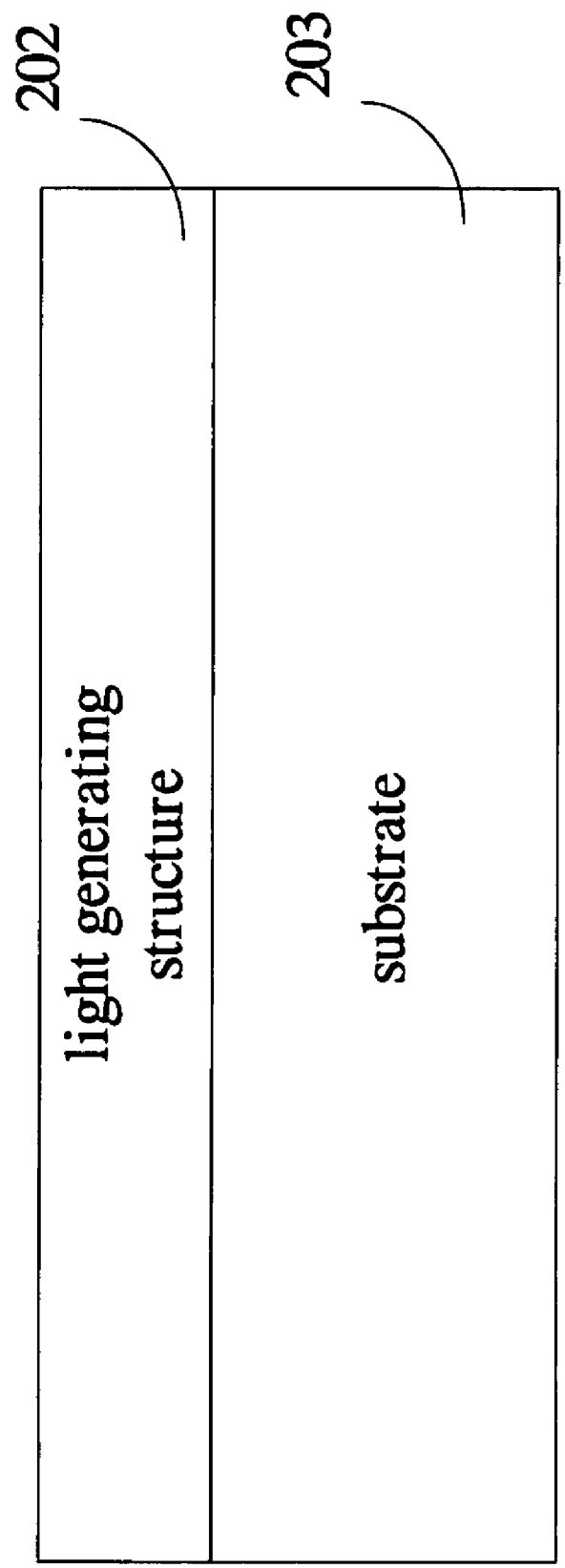
FIGS. 2a-2g are schematic sectional views showing the process of forming the first layered structures according to various embodiments of the present invention.

FIGS. 2a-2g are schematic sectional views showing the process of forming the first layered structures according to various embodiments of the present invention. As illustrated in FIG. 2a, a temporary growth substrate 203 is first provided and, then, a number of semiconductor layers forming the light generating structure 202 are sequentially grown on a side of the temporary growth substrate 203. The light generating structure 202 includes active p-n junction layers for generating lights in response to the conduction of current. The light generating structure 202 usually contains, but not limited to, a number of III-V compound semiconductor layers. The exact details of the light generating structure 202 are not critical to the present invention. For ease of reference, all directions towards or locations closer to the light generating structure 202 are referred to as the top direction or upper location, and the opposite as the bottom direction or lower location. The main consideration of substrate 203 is to achieve better luminous efficiency from the light generating structure 202. For example, substrate 203 is made of a material such as GaAs so that it is lattice-matched to the light generating structure 202.

Figure 2B:
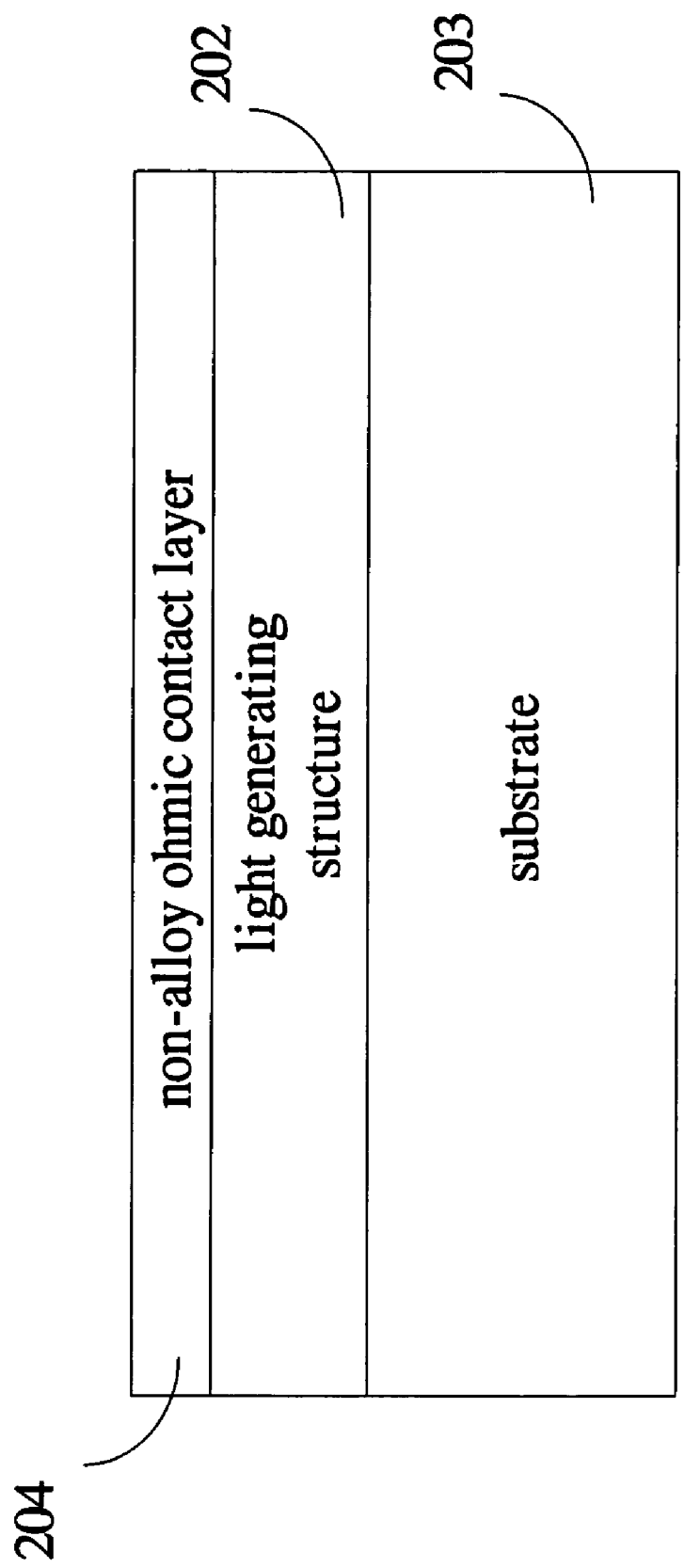

Then, as shown in FIG. 2b, a non-alloy ohmic contact layer 204 is subsequently deposited on the light generating structure 202 using epitaxial growth tools, vacuum evaporation, sputtering, or plating techniques. The forming of the non-alloy ohmic contact layer 204 can be performed right after the first growth process for the light generating structure 202 in the same reactor. In alternative embodiments, the epitaxial structure containing the light generating structure 202 and substrate 203 is prepared and stored separately. Then the non-alloy ohmic contact layer 204 is deposited on the stored epitaxial structure.

The non-alloy ohmic contact layer 204 is, but not limited to, an optically transparent or absorbing, p-type or n-type doped, semiconductor layer usually having a doping density at least $1E19/cm^3$. Typical examples of the non-alloy ohmic contact layer 204 include, but is not limited to: carbon-doped AlAs, carbon-doped GaP, carbon-doped AlP, carbon-doped AlGaAs, carbon-doped InAlAs, carbon-doped InGaP, carbon-doped InAlP, carbon-doped AlGaP, carbon-doped GaAsP, carbon-doped AlAsP, carbon-doped AlGaInP, carbon-doped AlGaInAs, carbon-doped InGaAsP, carbon-doped AlGaAsP, carbon-doped AlInAsP, carbon-doped InGaAlAsP, Mg-doped AlAs, Mg-doped GaP, Mg-doped AlP, Mg-doped AlGaAs, Mg-doped InAlAs, Mg-doped InGaP, Mg-doped InAlP, Mg-doped AlGaP, Mg-doped GaAsP, Mg-doped AlAsP, Mg-doped AlGaInP, Mg-doped AlGaInAs, Mg-doped InGaAsP, Mg-doped AlGaAsP, Mg-doped AlInAsP, Mg-doped InGaAlAsP, Zn-doped AlAs, Zn-doped GaP, Zn-doped AlP, Zn-doped AlGaAs, Zn-doped InAlAs, Zn-doped InGaP, Zn-doped InAlP, Zn-doped AlGaP, Zn-doped GaAsP, Zn-doped AlAsP, Zn-doped AlGaInP, Zn-doped AlGaInAs, Zn-doped InGaAsP, Zn-doped AlGaAsP, Zn-doped AlInAsP, Zn-doped InGaAlAsP, carbon-doped InP, carbon-doped InAs, carbon-doped GaAs, carbon-doped InAsP, Mg-doped InP, Mg-doped InAs, Mg-doped GaAs, Mg-doped InAsP, Zn-doped InP, Zn-doped InAs, Zn-doped GaAs, and Zn-doped InAsP. Please note that some of the above doped compound semiconductors, depending on the constituent element composition, could be either optically transparent or optically absorbing.

Figure 2C:
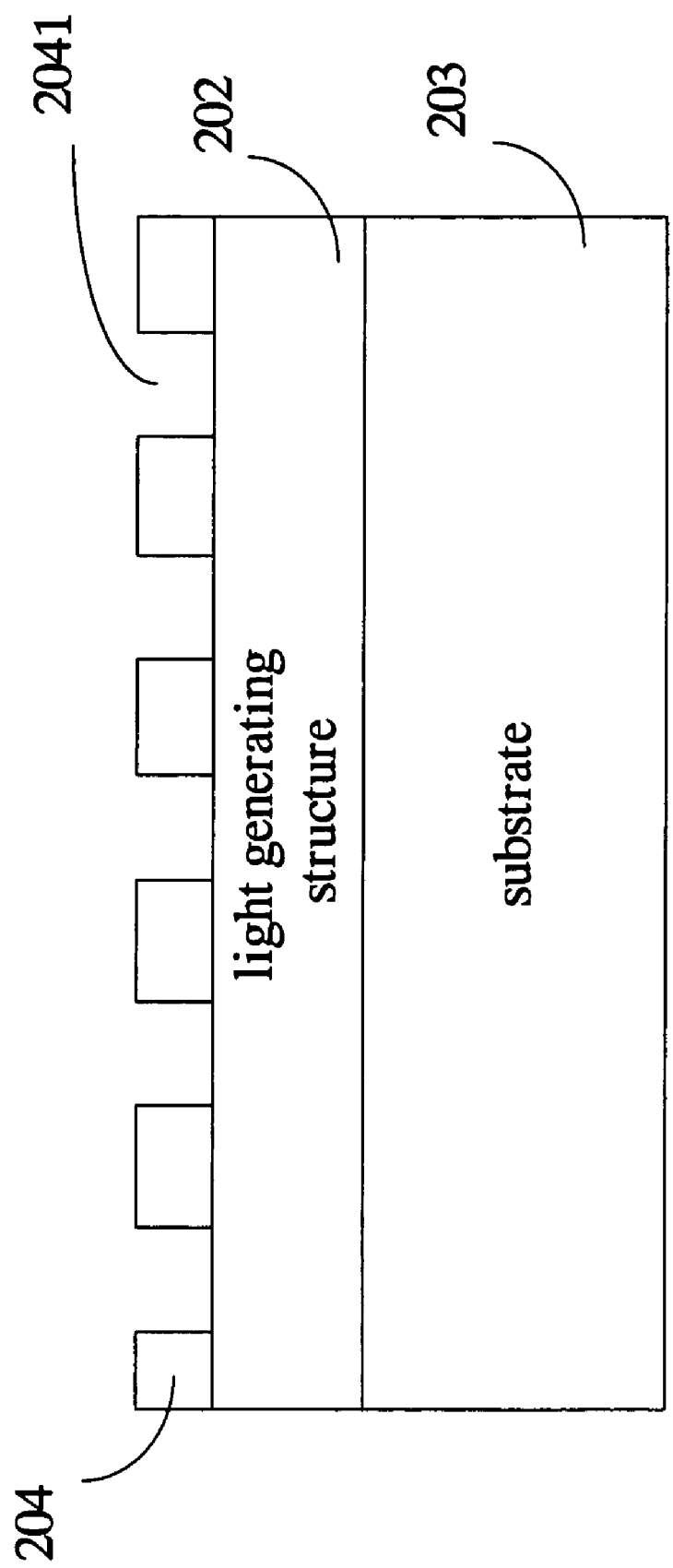

As shown in FIG. 2c, the non-alloy ohmic contact layer 204 could be optionally etched along its top surface to form a number of recesses 2041 after its deposition. The benefit of having the recesses 2041 is that they help controlling the injection current distribution. Another benefit of the recesses 2041 is that they reduce light absorption when the non-alloy ohmic contact layer 204 is made of an optically absorbing material. The depth of the etching is usually such that part of the light generating structure 202 is exposed.

Figure 2D:
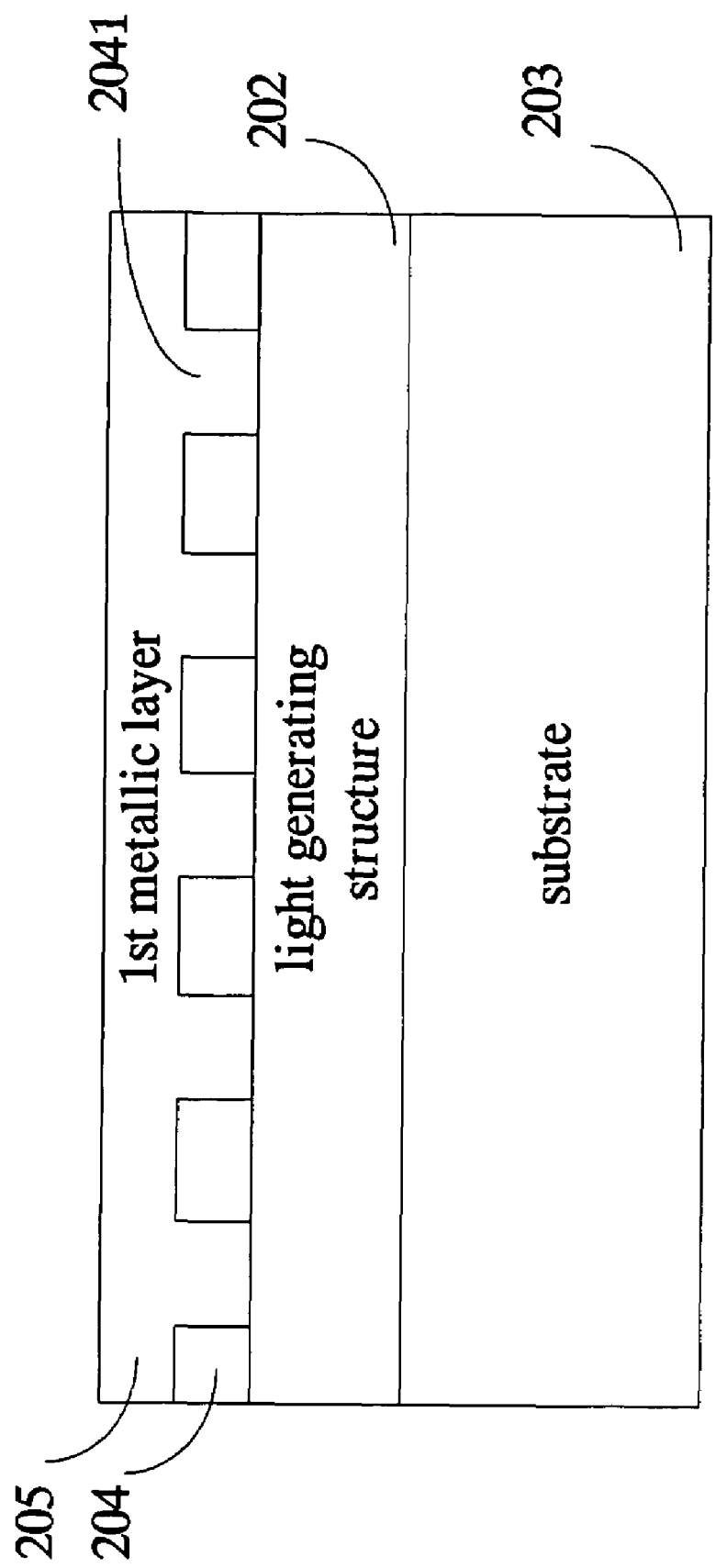

Then, as shown in FIG. 2d, the first metallic layer 205 is coated on the non-alloy ohmic contact layer 204 using vacuum evaporation, deposition, sputtering, or plating techniques. The first metallic layer 205 functions as a reflective mirror and, therefore, lights emitted from the light generating structure 202 toward the first metallic layer 205 would be reflected and directed back toward the light generating structure 202. The first metallic layer 205 is made of a pure metal such as Au, Al, Ag, or a metal nitride such as Titanium Nitride ($TiN_x$), Zirconium Nitride ($ZrN_x$), all with high reflectivity. Since pure metal or metal nitride is used to substitute the conventional alloy reflective mirror so as to achieve superior reflectivity and to avoid the high annealing temperature, the non-alloy ohmic contact layer 204 is deposited earlier to achieve the required low resistance electrical conduction between the light generating structure 202 and the first metallic layer 205. Up to this point, the provision of the first layered structure is completed.

Figure 2E:
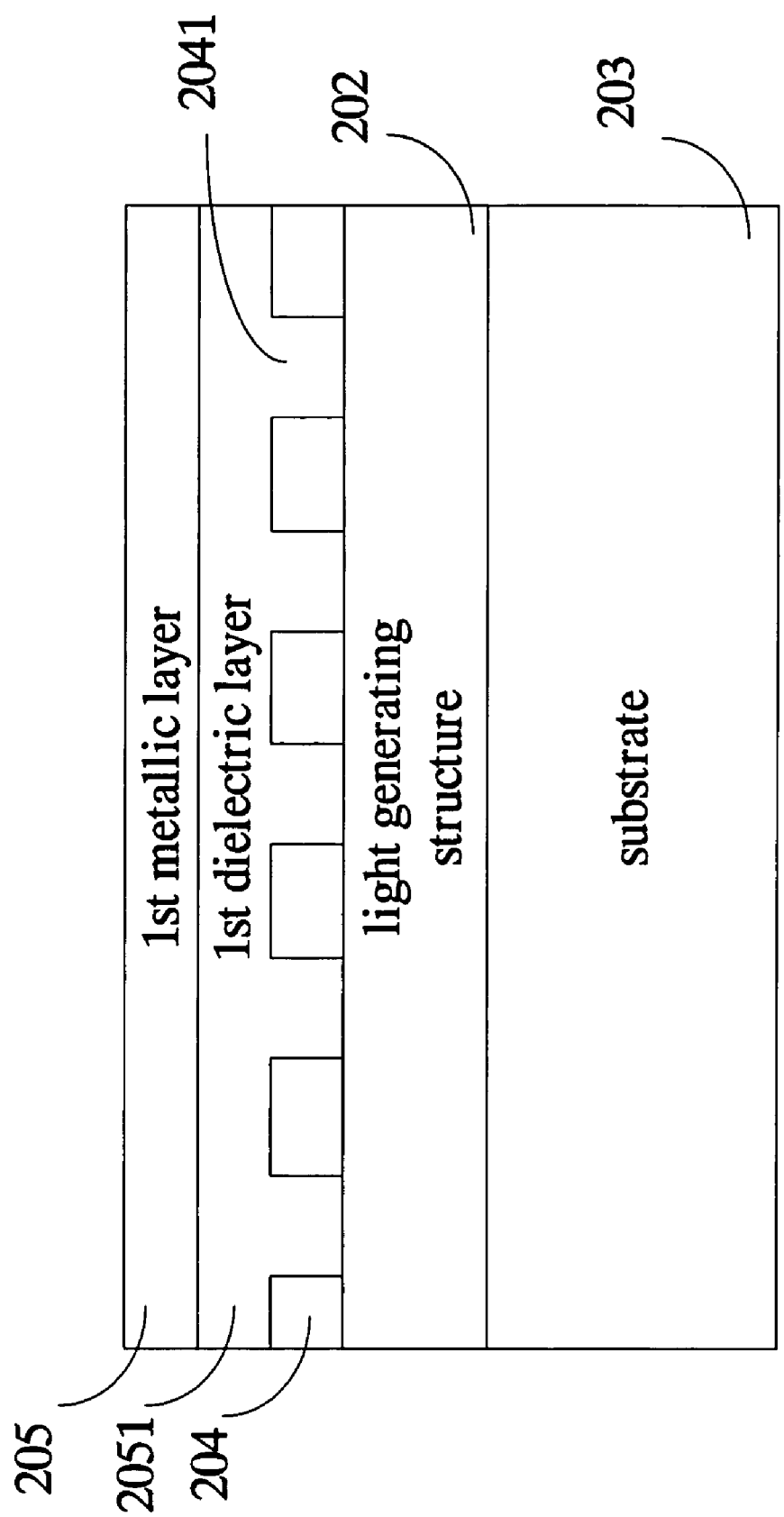

In an alternative embodiment, as depicted in FIG. 2e, an optically transparent and electrically conductive first dielectric layer 2051 is deposited on the non-alloy ohmic contact layer 204 before the deposition of the first metallic layer 205, whose purpose is to further prevent the intermixing between the first metallic layer 205 and the non-alloy ohmic contact layer 204, and the light generating structure 202 if there are recesses 2041, so as to maintain the reflectivity and the reflective surface flatness of the first metallic layer 205. The first dielectric layer 2051 is usually made of a transparent conductive oxide (TCO). Typical examples include, but are not limited to, Indium Tin Oxide (ITO), Indium Zinc Oxide (IZO), Tin Oxide (SnO), Antimony-doped SnO, Fluorine-doped SnO, Phosphorus-doped SnO, Zinc Oxide (ZnO), Aluminum-doped ZnO, Indium Oxide (InO), Cadmium Oxide (CdO), Cadmium Stannate (CTO), Copper Aluminum Oxide (CuAlO), Copper Calcium Oxide (CuCaO), and Strontium Copper Oxide (SrCuO).

Figure 2F:
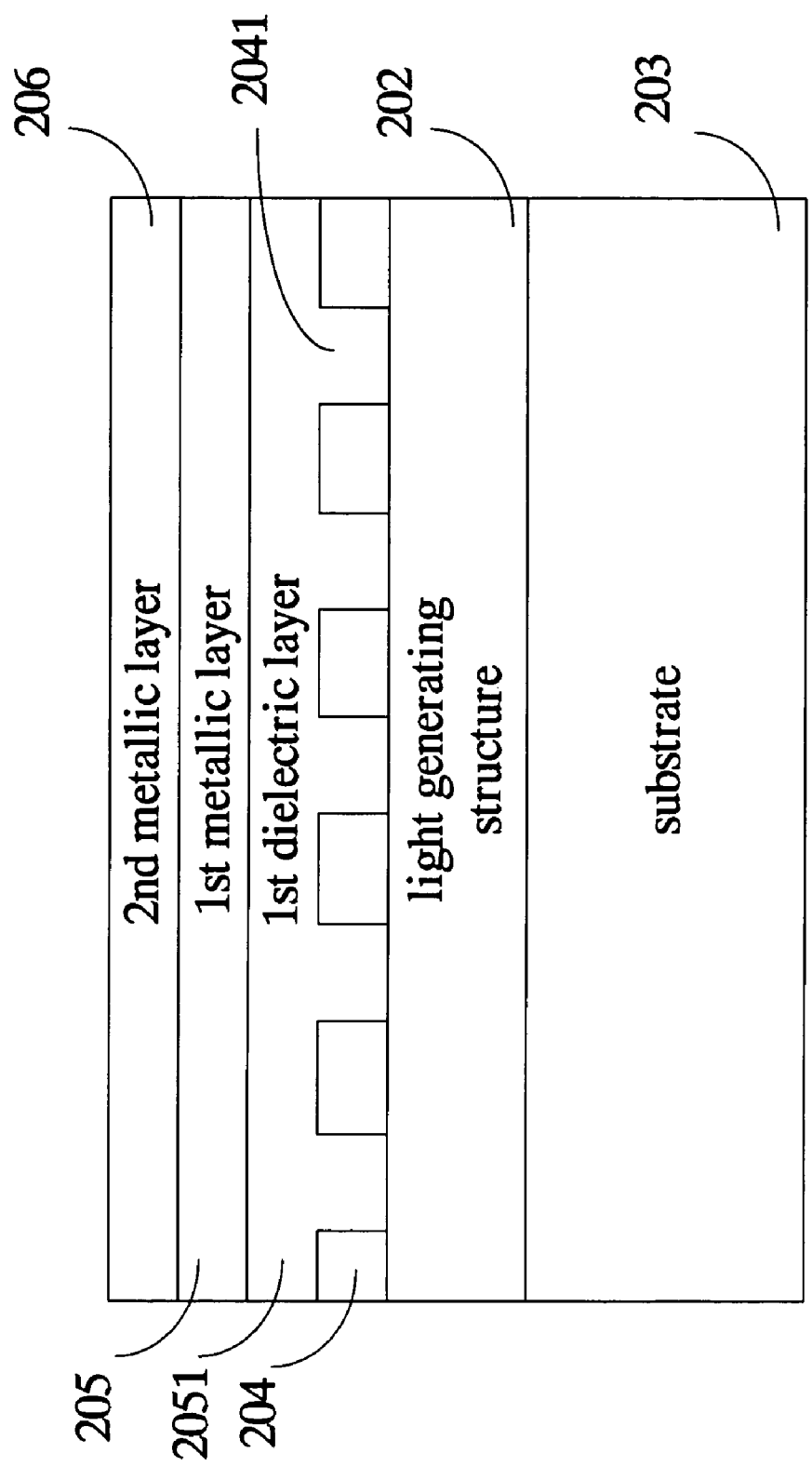

In another embodiment, as illustrated in FIG. 2f, in order to enhance the performance of the wafer-bonding process, a second metallic layer 206 could be further deposited on top of the first metallic layer 205. In other words, the first metallic layer 205, made of a pure metal or a metal nitride, is for reflecting lights from the light generating structure 202, while the second metallic layer 206, made of a pure metal or an alloy metal, is acting as a bonding agent during the subsequent wafer-bonding process. Similarly, to prevent the second metallic layer 206 from intermixing with the first metallic layer 205 and to maintain the reflectivity of the first metallic layer 205, a second dielectric layer 2061 could be deposited first on the first metallic layer 205, as illustrated in FIG. 2g.

Please note that, as the first metallic layer 205 functions as a reflective mirror, the optical characteristic of the second dielectric layer 2061 is of no significance. In addition, if the LED structure of FIG. 2g is to have its electrodes arranged in a vertical fashion, the second dielectric layer 2061 has to be electrically conductive so that a conduction path could be established between the electrodes. If the LED structure of FIG. 2g is to have its electrodes arranged in a planar fashion, whether the second dielectric layer 2061 is electrically conductive or not would affect the placement of one of the planar electrodes. More details about this will be given later.

Figure 2G:
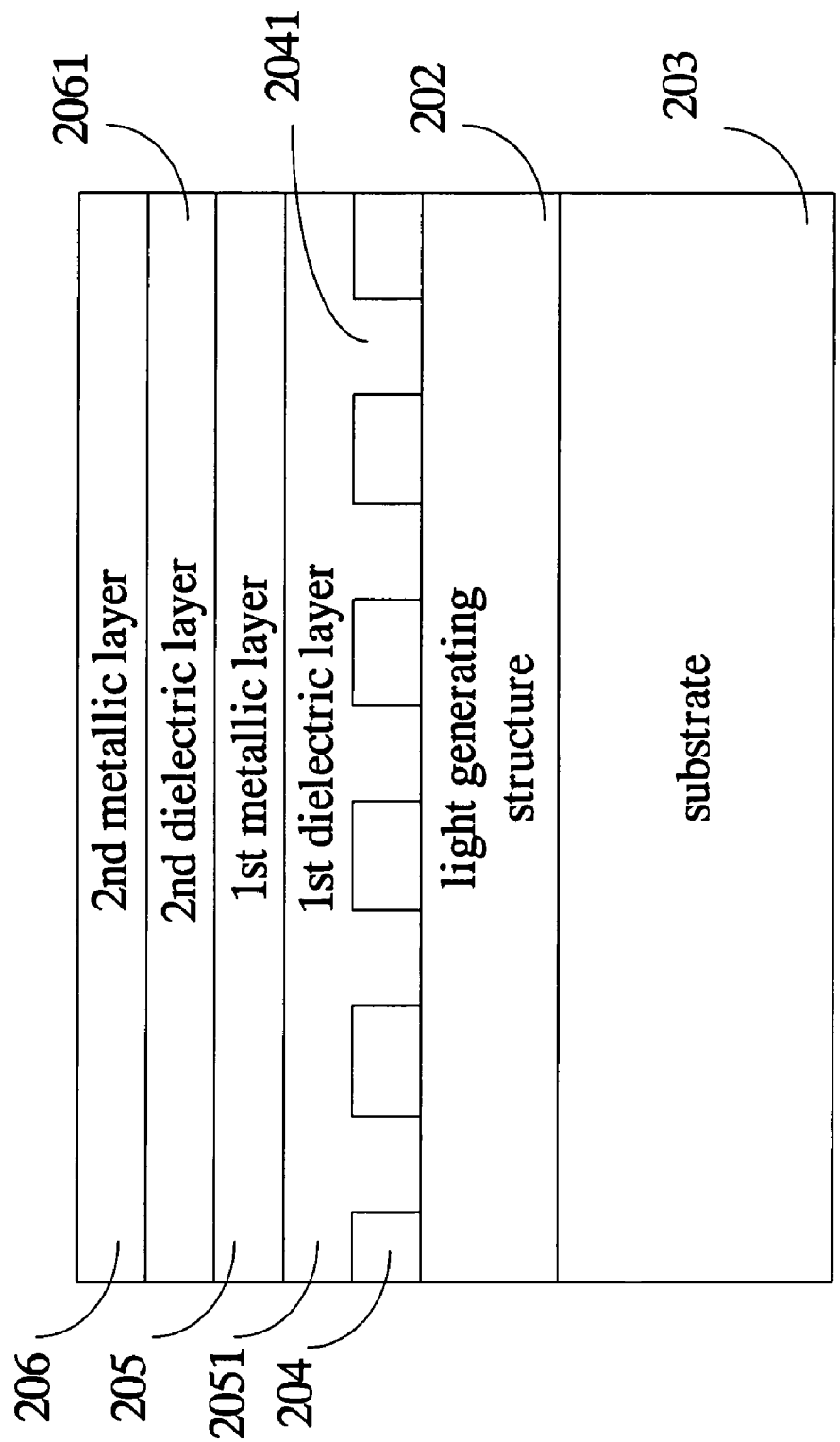

Please also note that there could be additional pairs of dielectric layer and metallic layer on top of the first layered structure of FIG. 2g. Similarly, these additional dielectric layers are not required to be optically transparent and electrically conductive, and these additional metallic layers could be made of a pure metal or an alloy metal. For second dielectric layer 2061 and those additional dielectric layers, as described above, they could be made of a transparent conductive oxide such as ITO, IZO, SnO, Antimony-doped SnO, Fluorine-doped SnO, Phosphorus-doped SnO, ZnO, Aluminum-doped ZnO, InO, CdO, CTO, CuAlO, CuCaO, SrCuO, a metal nitride such as $TiN_x$, $ZrN_x$ (which are not optically transparent), or an insulating material such as Silicon Nitride ($SiN_x$), Silicon Oxide ($SiO_x$).

Figure 3A:
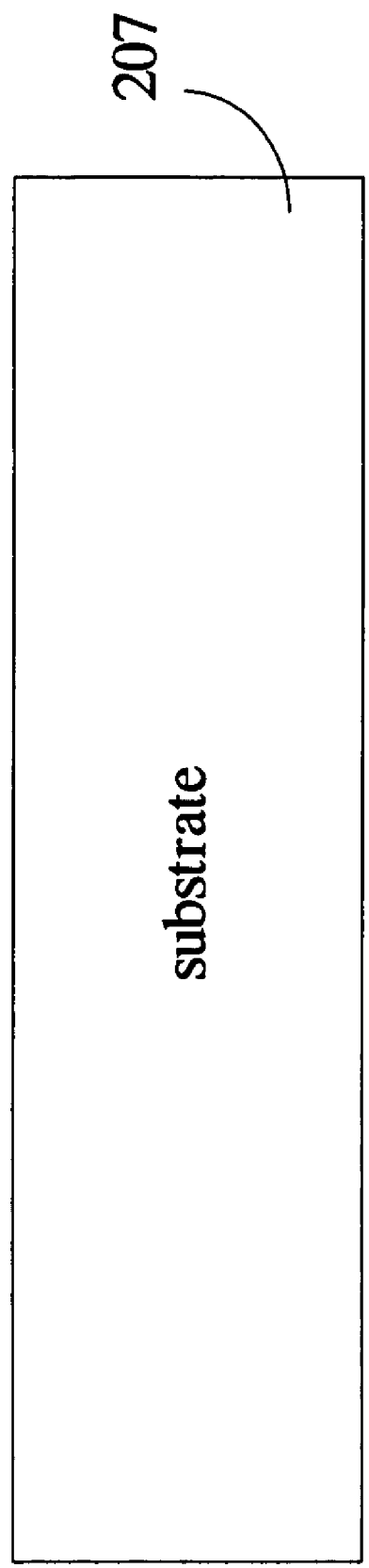
FIGS. 3a-3c are schematic sectional views showing the second layered structures according to various embodiments of the present invention.
Figure 3B:
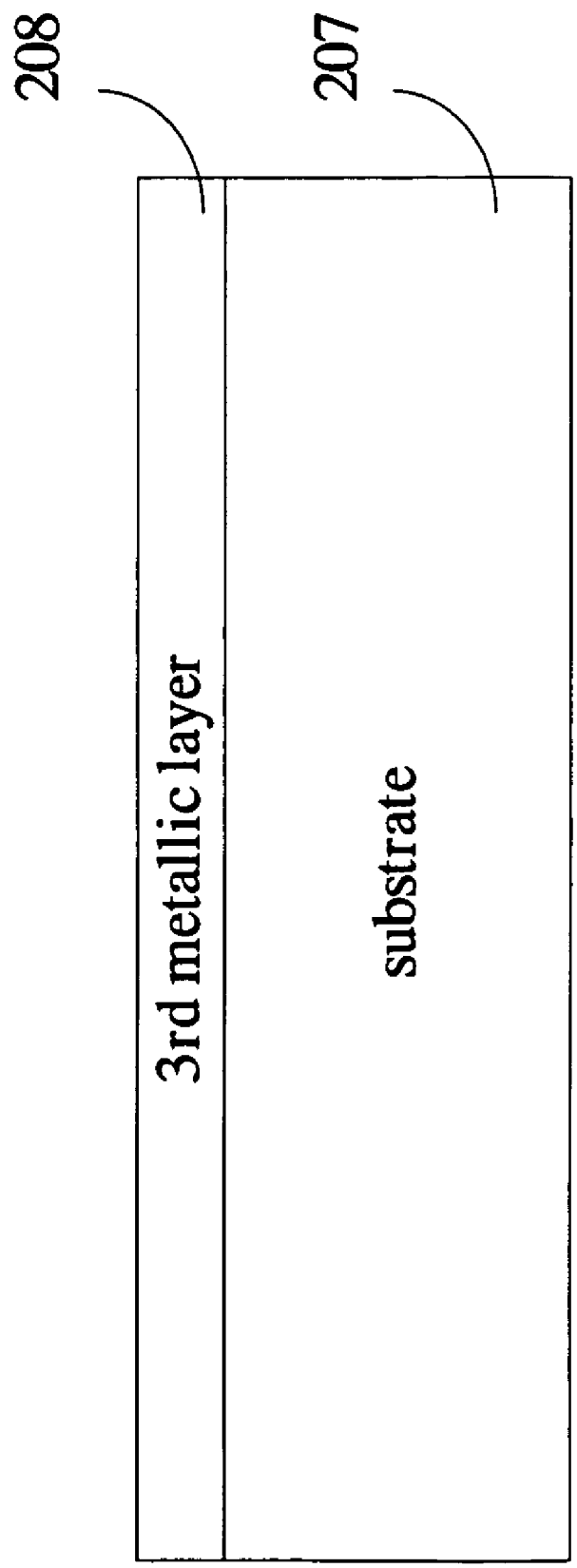
Figure 3C:
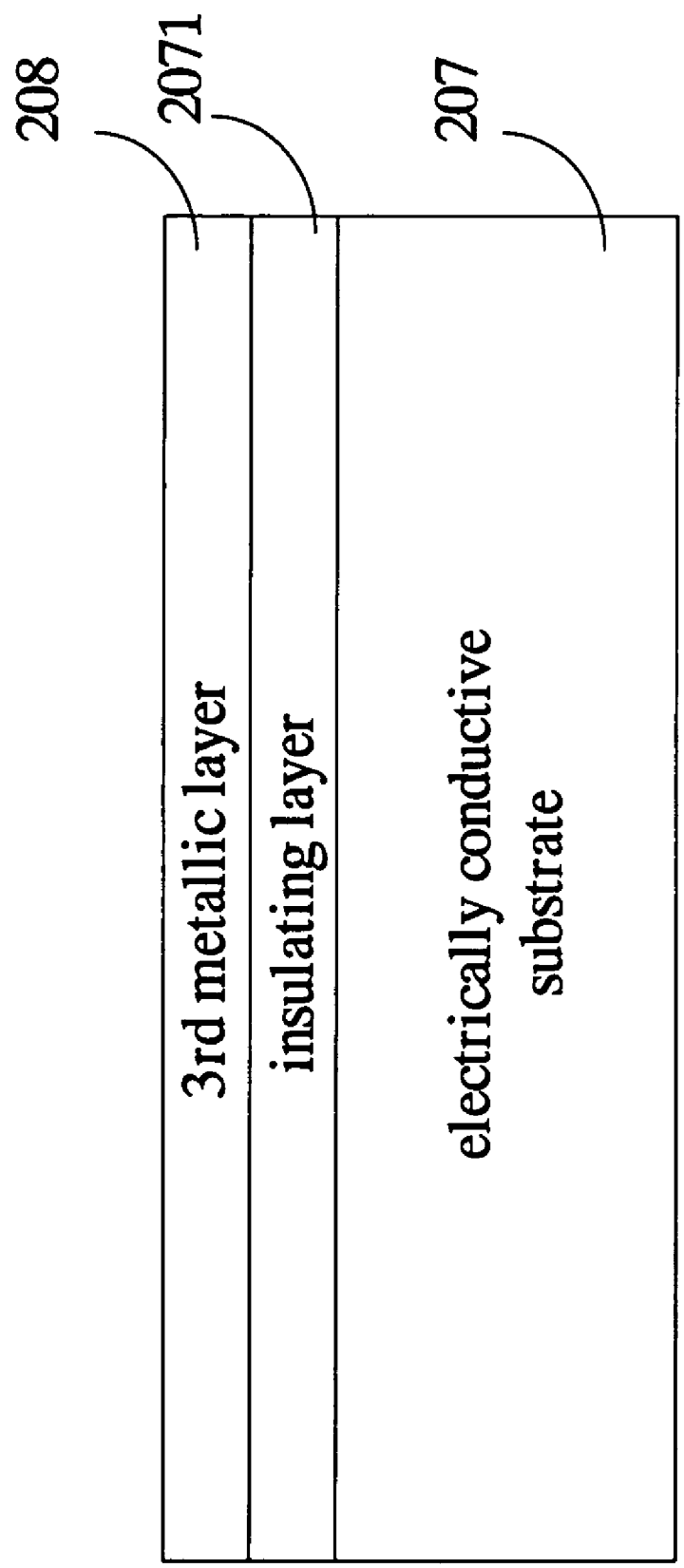

FIGS. 3a-3c are schematic sectional views showing the second layered structures according to various embodiments of the present invention. As shown in FIG. 3a, the simplest form of the second layered structure contains only a permanent substrate 207. In alternative embodiment, at least a third metallic layer 208 is further deposited on a top side of the permanent substrate 207 using vacuum evaporation, deposition, sputtering, or plating techniques, as shown in FIG. 3b. Similar to the second metallic layer 206, the third metallic layer 208 could be made of a pure or alloy metal, and whose purpose is also for enhancing the performance of the wafer-bonding process. After the deposition of the third metallic layer 208, an optional annealing process could be subsequently employed to improve the electrical conductivity or the adhesion of third metallic layer 208.

Since, in the final LED structure after the wafer-bonding process, the first metallic layer 205 would reflect most (if not all) of the lights incident toward the substrate 207, the optical characteristic of the substrate 207 is of no significance. The substrate 207 could be a semiconductor substrate, a metallic substrate, or other appropriate substrate.

The substrate 207 could be electrically conductive or non-electrically conductive. Typical material choice for the electrically conductive substrate 207 includes, but is not limited to: doped Ge, doped Si, doped GaAs, doped GaP, doped InP, doped InAs, doped GaN, doped AlGaAs, doped SiC, doped GaAsP, Mo, Cu and Al. Typical material choice for the non-electrically conductive substrate 207' includes, but is not limited to: Ge, Si, GaAs, GaP, InP, InAs, GaN, AlN, AlGaAs, SiC, GaAsP, sapphire, glass, quartz, and ceramic.

Whether the substrate 207 is electrically conductive or not would affect how the electrodes for the final LED structure could be configured during the subsequent chip process. If the substrate 207 is non-electrically conductive, the electrodes have to be arranged in a planar fashion. If the substrate 207 is electrically conductive, the electrodes could be arranged either in a vertical fashion or in a planar fashion. If the LED structure would like to have planar electrode arrangement on an electrically conductive substrate, the present invention could deposit an insulating layer 2071 immediately on top of the substrate 207 before forming the optional third metallic layer 208, as illustrate in FIG. 3c. The insulating layer 2071 is made of one of the following materials: $SiN_x$ and $SiO_x$. The formation of the insulating layer 2071 could be achieved by letting the substrate 207 undergo an oxidation process. Please note that it is possible to have no insulating layer 2071 if at least one of the second dielectric layer 2061 and the additional dielectric layers is non-electrically conductive. However, as the dielectric layers usually couldn't provide the required insulation, the insulating layer 2071 is still implemented. Please note that, for an even better insulation property, the insulating layer 2071 could be implemented in with non-electrically conductive substrate 207 as well.

Figure 4A:
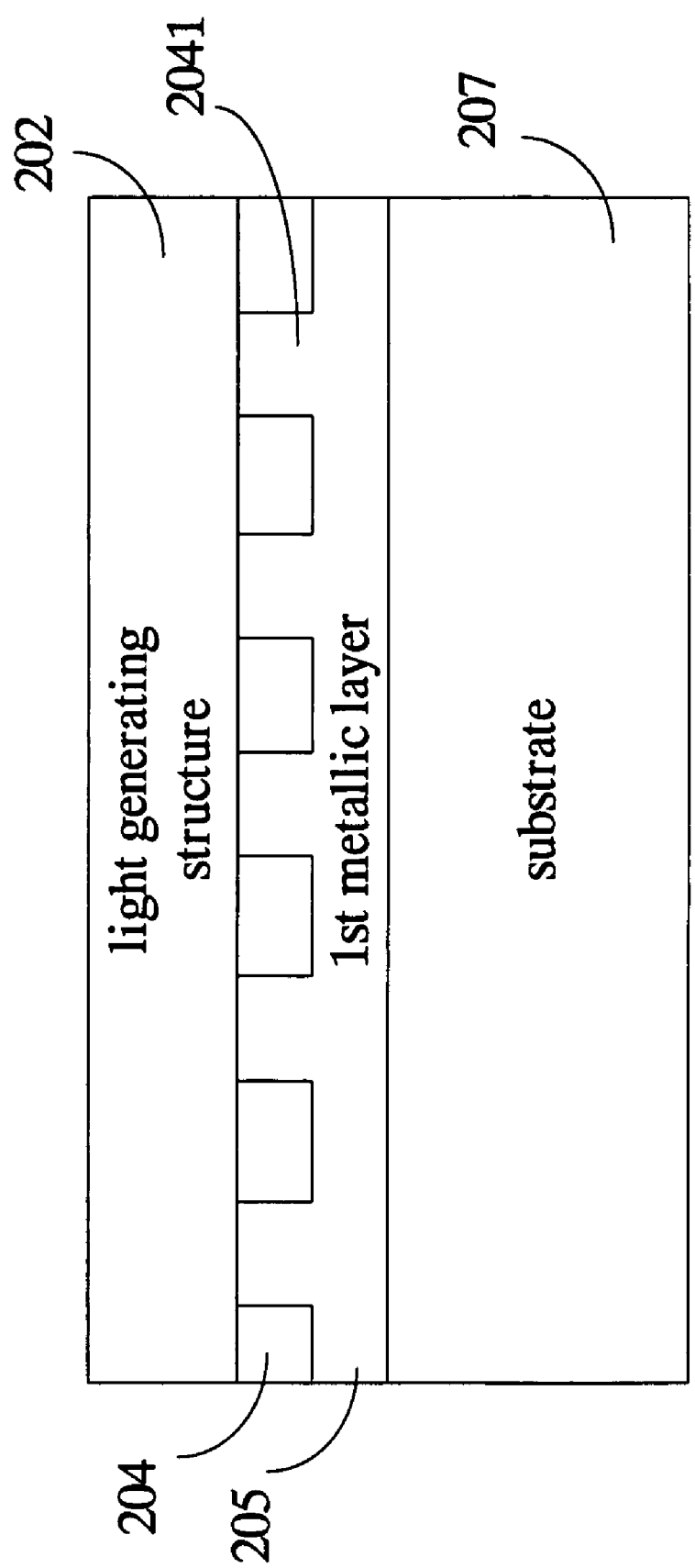
FIGS. 4a-4f are schematic sectional views showing the LED structures produced by various embodiments of the present invention.
Figure 4B:
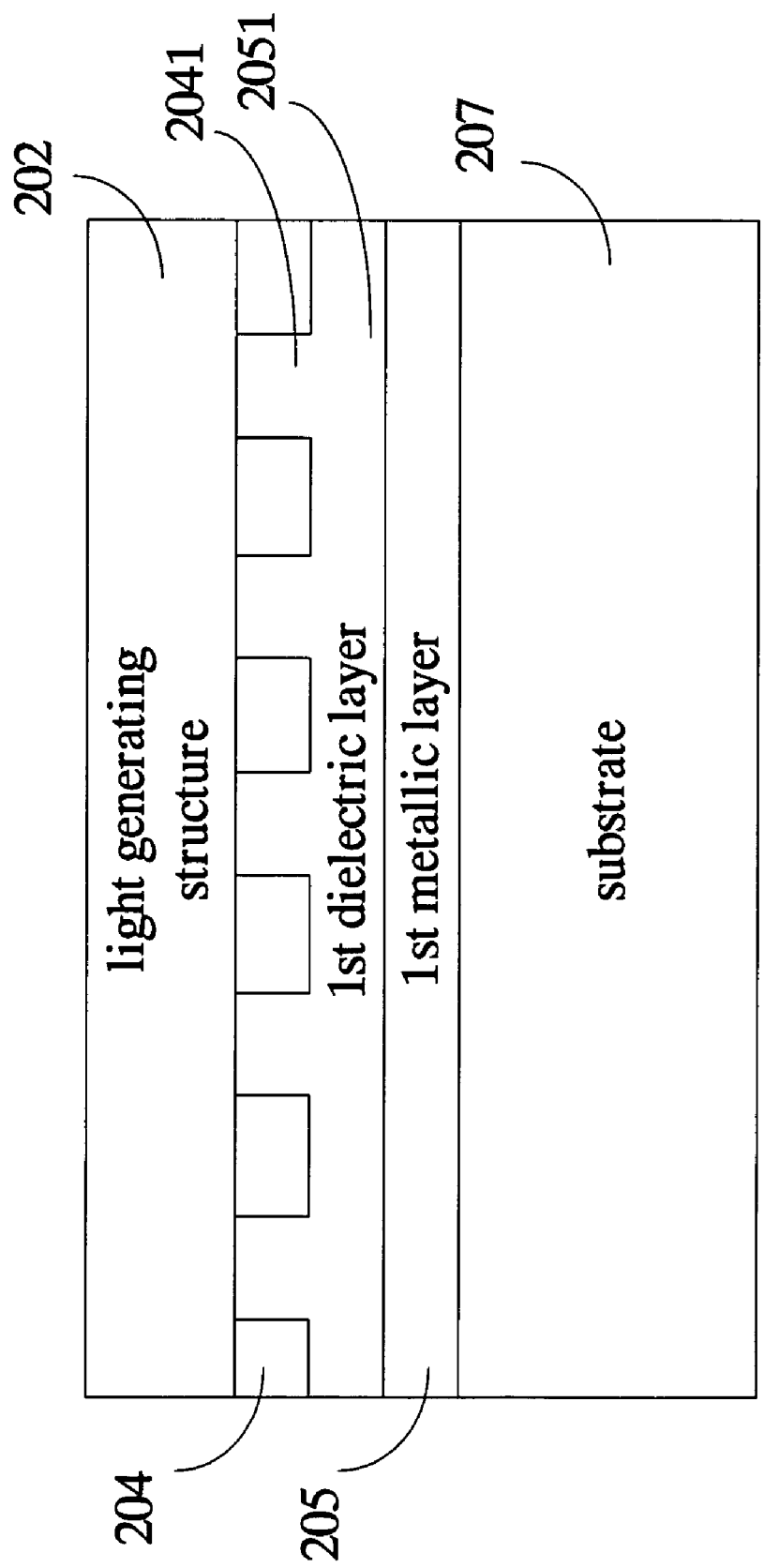
Figure 4C:
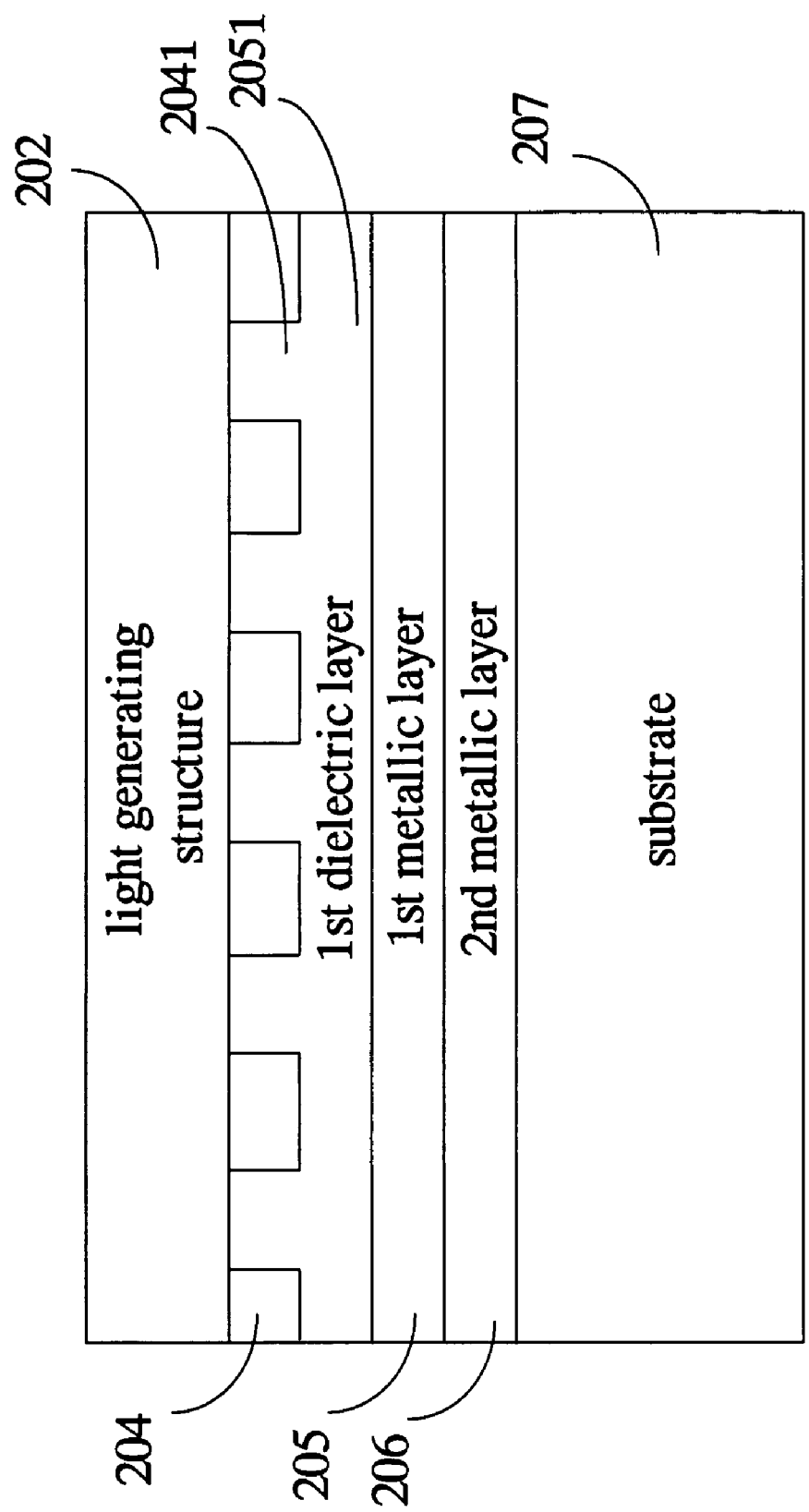
Figure 4D:
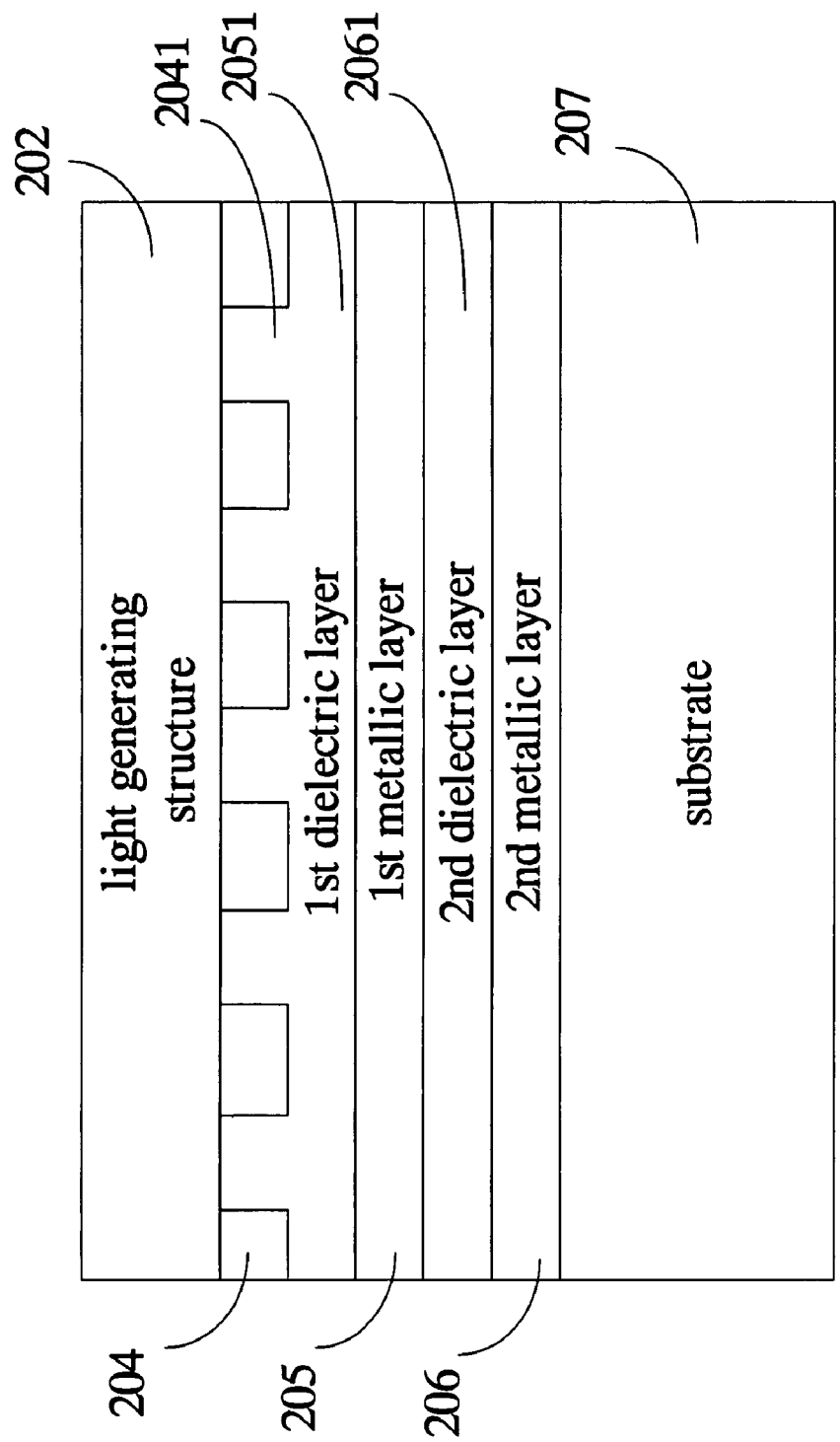
Figure 4E:
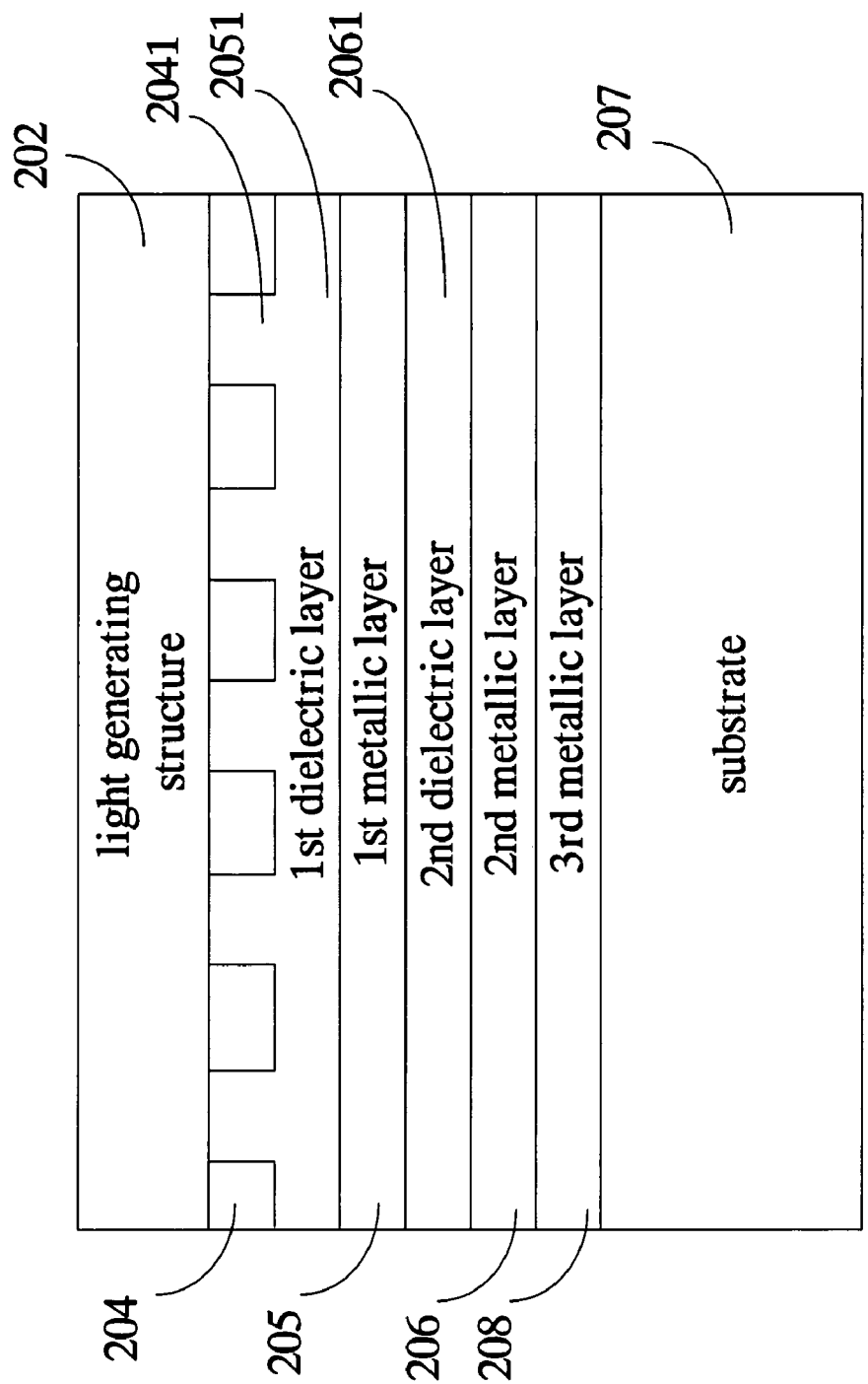
Figure 4F:
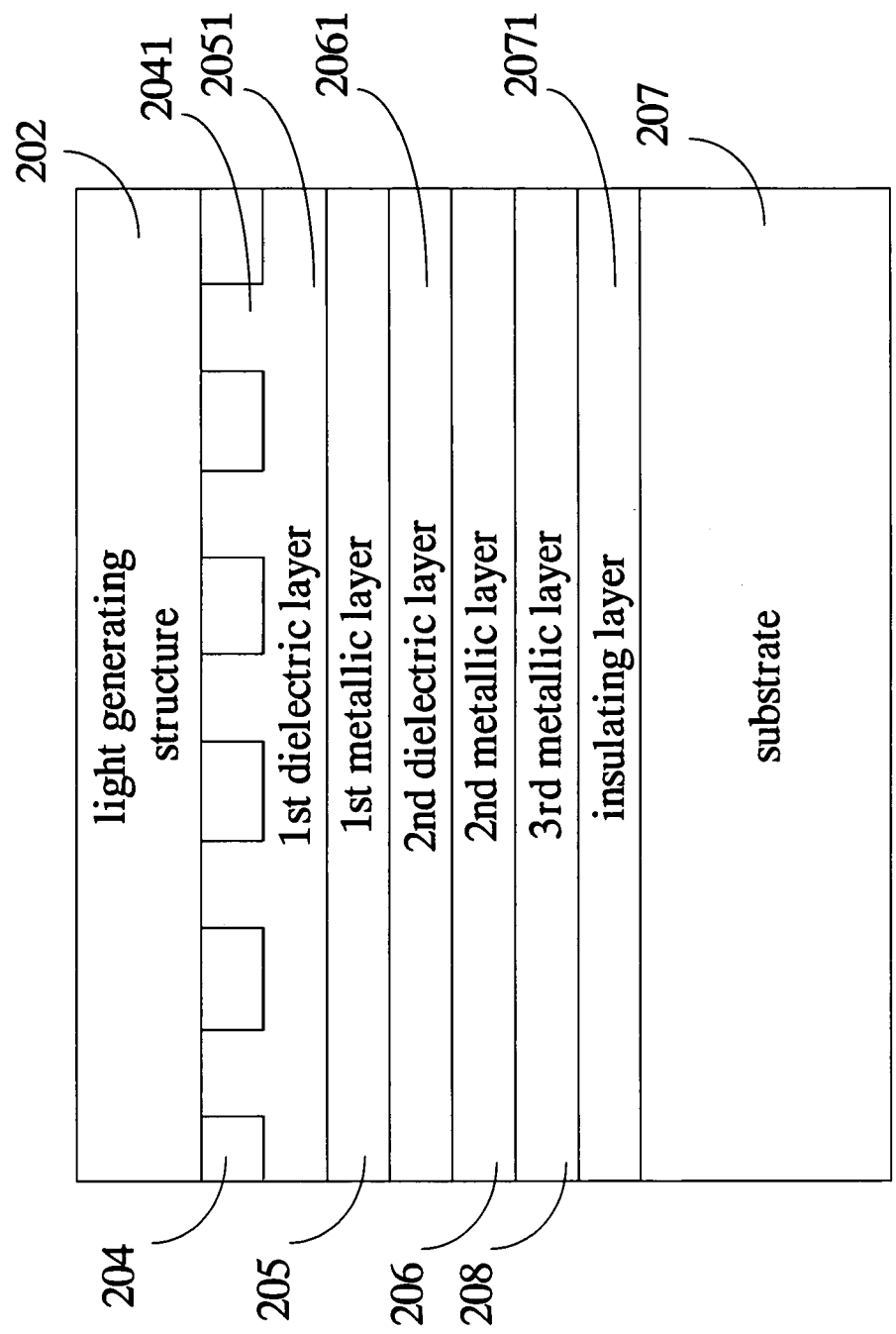

Up to this point, both the first and second layered structures are ready. Then, a wafer bonding process is conducted to join one of the first layered structures shown in FIGS. 2d-2g and one of the second structures shown in FIGS. 3a-3c, with the top of the first layered structure interfacing with the top side of the second layered structure. During the wafer-bonding process, a separate bonding agent other than the second and third metallic layers 206 and 208 could be adopted to further facilitate the bonding process. The temporary growth substrate 203 is then removed. As the removal of the temporary growth substrate 203 is performed after the light generating structure 202 is bonded to the permanent substrate 207, the problem of light generating structure 202 being too thin to handle is avoided accordingly. Please note that the temporary substrate 203 could also be removed prior to the wafer-bonding process, if required. Up to this point, an LED structure according to the present invention is formed. The wafer-bonding process and the temporary substrate removal are quite common to people skilled in the related arts. FIGS. 4a-4d show the final LED structures of combining the second layered structure of FIG. 3a with the first layered structures of FIGS. 2d-2g, respectively. FIGS. 4e-4f shows the final LED structures of combining the first layered structure of FIG. 2g with the second layered structures of FIGS. 3b-3c respectively.

Compared to prior arts that wafer-bond the reflective mirror to the light generating structure, the present invention directly coats the first metallic layer 205 (i.e., the reflective mirror) on the light generating structure 202 in vacuum prior to the wafer-bonding process. The mirror's reflective surface is not directly involved in the bonding interface during the wafer-bonding process. Therefore, roughness of the reflective surface or reactions and contaminations to the mirror's reflective surface can be avoided. The first metallic layer 205 of the present invention thereby offers a much superior reflectivity than the reflective mirrors formed using prior arts.

Figure 5A:
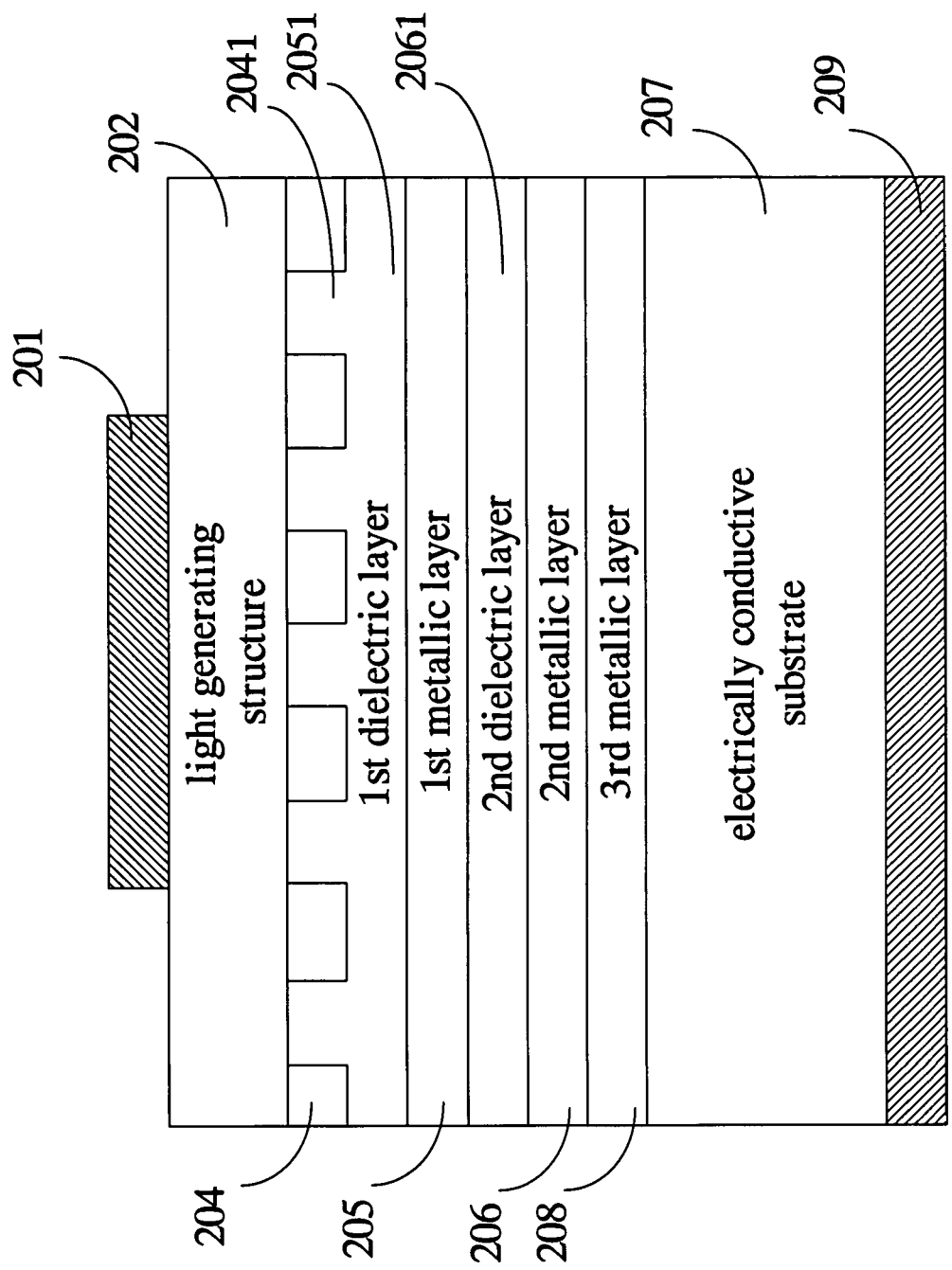
FIGS. 5a-5c are schematic sectional views showing an LED structure according to a fourth embodiment of the present invention.
Figure 5B:
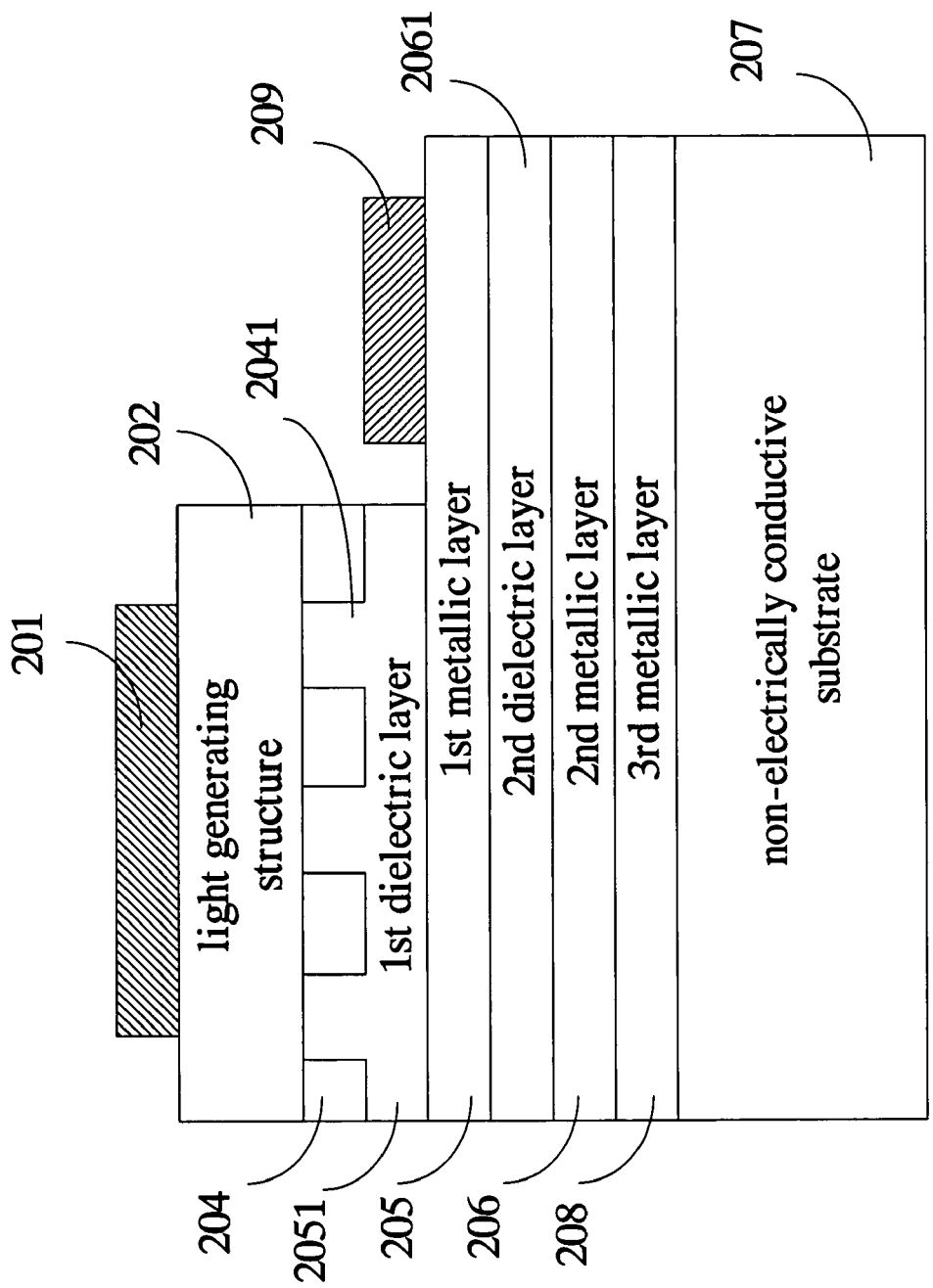
Figure 5C:
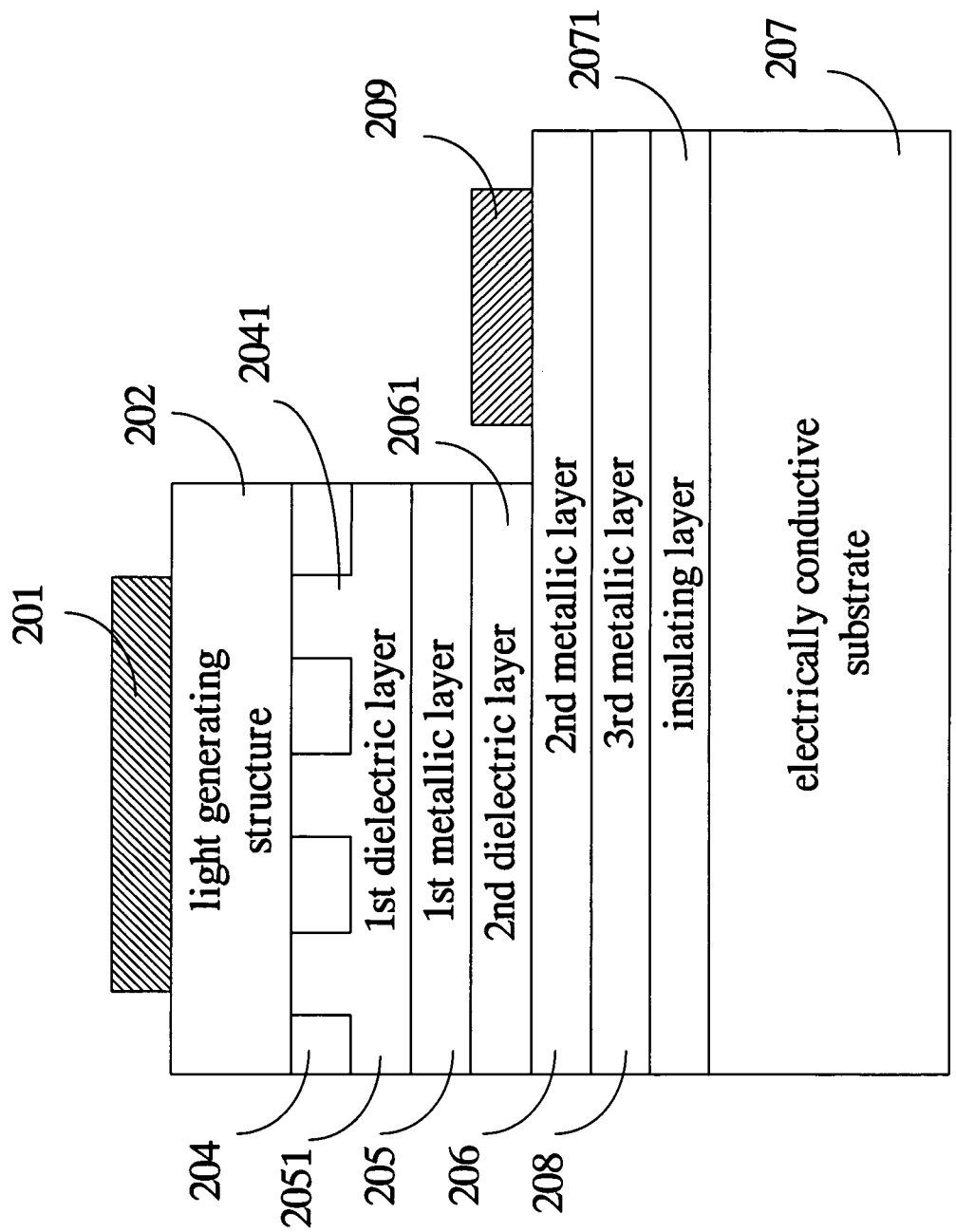

Subsequently, a conventional chip process could be conducted to manufacture LED chips from the LED structure. This involves forming the anode and cathode at appropriate places on the LED structure of the present invention, in addition to tasks such as cleaning the LED structure by wet or dry chemical techniques to remove residual contamination, and removing the cleaning solvent or water by baking, blowing, or wafer spinning, etc. For vertical electrode arrangement, as shown in FIG. 5a, the substrate 207 and all dielectric layers must all be electrically conductive so that a conduction path is available between the two electrodes 201 and 209. If the substrate 207 is non-electrically conductive as depicted in FIG. 5b, or is insulated by an insulating layer 2071 as depicted in FIG. 5c, the electrodes have to be arranged in a planar fashion. For planar electrode arrangement, as illustrated in FIGS. 5b and 5c, part of the LED structure is etched up to an appropriate depth so that a region of one of the metallic layers located between the non-alloy ohmic contact layer 204 and the substrate 207 is exposed. In the embodiment of FIG. 5b, it is etched so that a region of the first metallic layer 205 is exposed. The electrodes 201 and 209 are then formed on the light generating structure 202 and the exposed region of the first metallic layer 205 respectively. Please note that, if there are multiple metallic layers and as long as a conduction path could be established between the electrodes 201 and 209, there is no specific constraint on how far down the LED structure the etching could go. For example, in FIG. 5c, the LED structure is etched until a region of the second metallic layer 206 is exposed. As mentioned earlier, whether the second dielectric layer 2061 is electrically conductive or not would affect the placement of one of the planar electrodes. Therefore, for the planar arrangement of the electrodes 201 and 209 in FIG. 5c to work, the second dielectric layer 2061 has to be electrically conductive. On the other hand, the second dielectric layer 2061 in FIG. 5b could be non-electrically conductive as it is not on the conduction path between the electrodes 201 and 209.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for fabricating a light emitting diode structure, comprising the steps of:
   (a) forming a light generating structure on a top side of a first substrate;
   (b) forming a non-alloy ohmic contact layer on a top side of said light generating structure, said non-alloy ohmic contact layer being a doped semiconductor;
   (c) forming an optically transparent and electrically conductive dielectric layer directly on a top side of said non-alloy ohmic contact layer;
   (d) forming a first metallic layer above said dielectric layer, thereby completing a first layered structure on said top side of said first substrate;
   (e) providing a second layered structure comprising a second substrate; and (f) wafer-bonding a top side of said second layered structure to a top side of said first layered structure.

2. The method as claimed in claim 1 further comprising a step of:
removing said first substrate after said step (f).

3. The method as claimed in claim 1 further comprising a step of:
removing said first substrate before said step (f).

4. The method as claimed in claim 1, wherein said step (a) and said step (b) are conducted in a same growth process.

5. The method as claimed in claim 1, wherein said first metallic layer is made of one of a pure metal and a metal nitride.

6. The method as claimed in claim 5, wherein said first metallic layer is made of one of the following materials: Au, Al, Ag, $TiN_x$ and $ZrN_x$.

7. The method as claimed in claim 1, wherein said dielectric layer is made of a transparent conductive oxide.

8. The method as claimed in claim 7, wherein said dielectric layer is made of one of the following materials: ITO, IZO, SnO, Antimony-doped SnO, Fluorine-doped SnO, Phosphorus-doped SnO, ZnO, Aluminum-doped ZnO, InO, CdO, CTO, CuAlO, CuCaO, and SrCuO.

9. The method as claimed in claim 1, further comprising the following step:
forming a second metallic layer above said first metallic layer, said second metallic layer functioning as a bonding agent.

10. The method as claimed in claim 9, wherein said second metallic layer is made of one of a pure metal and an alloy metal.

11. The method as claimed in claim 9, further comprising the following step before forming said second metallic layer:
forming a second dielectric layer on a top side of said first metallic layer.

12. The method as claimed in claim 11, wherein said second dielectric layer is made of one of the following three types of materials: transparent conductive oxide, metal nitride, and insulating material.

13. The method as claimed in claim 12, wherein said second dielectric layer is made of one of the following materials: ITO, IZO, SnO, Antimony-doped SnO, Fluorine-doped SnO, Phosphorus-doped SnO, ZnO, Aluminum-doped ZnO, InO, CdO, CTO, CuAlO, CuCaO, SrCuO, $TiN_x$, $ZrN_x$, $SiN_x$, and $SiO_x$.

14. The method as claimed in claim 1, wherein said second layered structure further comprises a third metallic layer on a top side of said second substrate.

15. The method as claimed in claim 14, wherein said third metallic layer is made of one of a pure metal and an alloy metal.

16. The method as claimed in claim 1, wherein said second layered structure further comprises an insulation layer on a top side of said second substrate.

17. The method as claimed in claim 16, wherein said insulating layer is made of one of the following materials: SiN and $SiO_x$.

18. The method as claimed in claim 1, wherein said first substrate is an electrically conductive substrate.

19. The method as claimed in claim 18, wherein said first substrate is made of one of the following materials: doped Ge, doped Si, doped GaAs, doped GaP, doped InP, doped InAs, doped GaN, doped AlGaAs, doped SiC, doped GaAsP, Mo, Cu, and Al.

20. The method as claimed in claim 1, wherein said second substrate is a non-electrically conductive substrate.

21. The method as claimed in claim 20, wherein said second substrate is made of one of the following materials: Ge, Si, GaAs, GaP, InP, InAs, GaN, AlN, AlGaAs, SiC, GaAsP, sapphire, glass, quartz, and ceramic.

22. The method as claimed in claim 1, wherein said non-alloy ohmic contact layer is made of one of the following materials: carbon-doped AlAs, carbon-doped GaP, carbon-doped AlP, carbon-doped AlGaAs, carbon-doped InAlAs, carbon-doped InGaP, carbon-doped InAlP, carbon-doped AlGaP, carbon-doped GaAsP, carbon-doped AlAsP, carbon-doped AlGaInP, carbon-doped AlGaInAs, carbon-doped InGaAsP, carbon-doped AlGaAsP, carbon-doped AlInAsP, carbon-doped InGaAlAsP, carbon-doped InP, carbon-doped InAs, carbon-doped GaAs, and carbon-doped InAsP.

23. The method as claimed in claim 1, further comprising the following step after said step (b):
forming a plurality of recesses along said top side of said non-alloy ohmic contact layer.

24. The method as claimed in claim 1, wherein said non-alloy ohmic contact layer has a doping density at least $1E19/cm^{-3}$.

* * * * *

(12) EX PARTE REEXAMINATION CERTIFICATE (7761st)
United States Patent
Liu et al.

(10) Number: US 7,384,808 C1
(45) Certificate Issued: Sep. 21, 2010

(54) FABRICATION METHOD OF HIGH-BRIGHTNESS LIGHT EMITTING DIODE HAVING REFLECTIVE LAYER

(75) Inventors: Jin-Hsiang Liu, Taipei (TW); Hui-Heng Wang, Taoyuan (TW); Kun-Chuan Lin, Taipei (TW)

(73) Assignee: Huga Optotech Inc., Taichung (TW)

Reexamination Request:
No. 90/010,632, Aug. 3, 2009

Reexamination Certificate for:
Patent No.: 7,384,808
Issued: Jun. 10, 2008
Appl. No.: 11/180,002
Filed: Jul. 12, 2005

(51) Int. Cl.
*H01L 21/00* (2006.01)
*H01L 33/00* (2006.01)

(52) U.S. Cl. .............. 438/29; 438/22; 438/45; 257/E21.016; 257/E33.068

(58) Field of Classification Search .......... None
See application file for complete search history.

(56) References Cited

U.S. PATENT DOCUMENTS

| | | |
|---|---|---|
| 5,376,580 A | 12/1994 | Kish et al. |
| 6,350,997 B1 | 2/2002 | Saeki |
| 6,479,836 B1 | 11/2002 | Suzuki et al. |
| 6,797,987 B2 | 9/2004 | Chen |
| 6,998,642 B2 | 2/2006 | Lin et al. |
| 7,078,735 B2 | 7/2006 | Shono et al. |

*Primary Examiner*—Erik Kielin

(57) ABSTRACT

A method for fabricating a high brightness LED structure is disclosed herein, which comprises at least the following steps. First, a first layered structure is provided by sequentially forming a light generating structure, a non-alloy ohmic contact layer, and a first metallic layer from bottom to top on a side of a first substrate. Then, a second layered structure comprising at least a second substrate is provided. Then, the two-layered structures are wafer-bonded together, with the top side of the second layered structure interfacing with the top side of said first layered structure. The first metallic layer functions as a reflective mirror, which is made of a pure metal or a metal nitride to achieve superior reflectivity, and whose reflective surface does not participate in the wafer-bonding process directly.

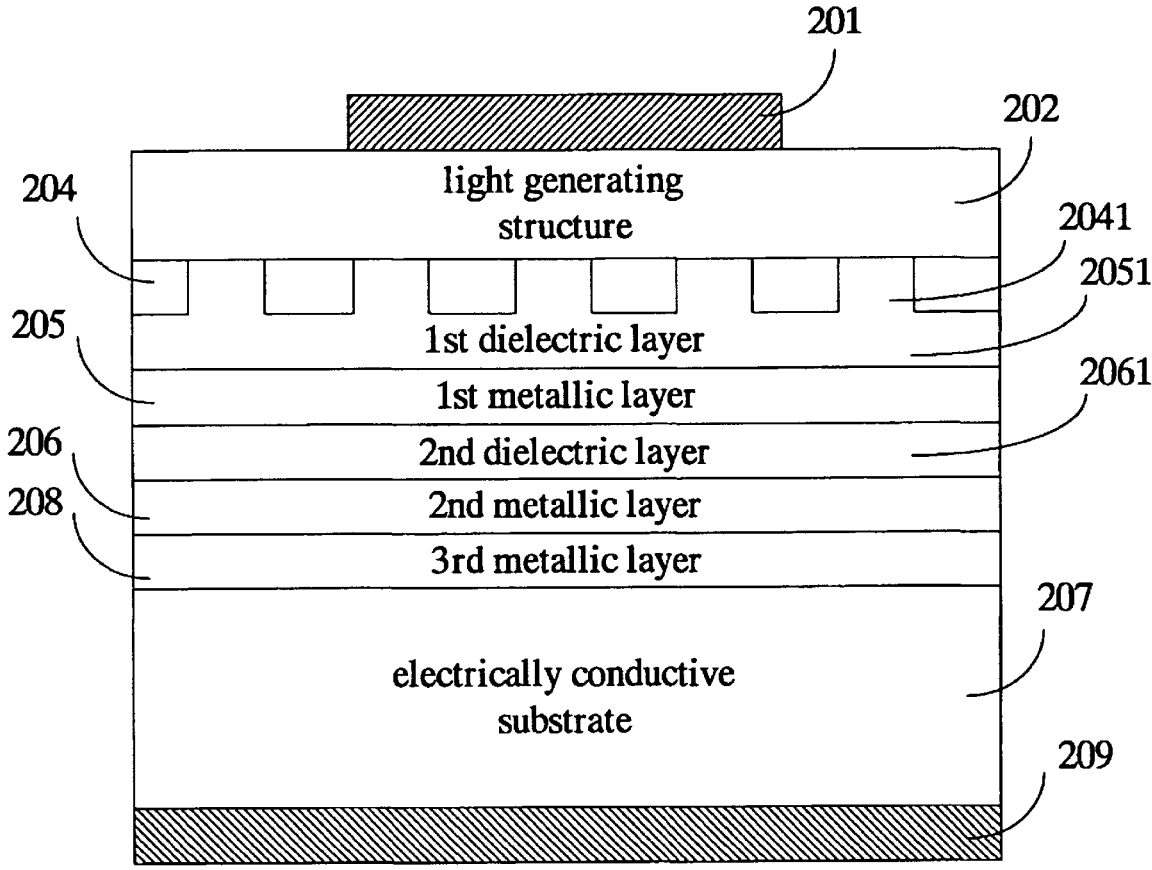

US 7,384,808 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 16 and 20 are determined to be patentable as amended.

Claims 2-15, 17-19 and 21-24, dependent on an amended claim, are determined to be patentable.

New claims 25-29 are added and determined to be patentable.

1. A method for fabricating a light emitting diode structure, comprising the steps of:
   (a) forming a light generating structure on a top side of a first substrate;
   (b) forming a non-alloy ohmic contact layer on a top side of said light generating structure, said non-alloy ohmic contact layer being a doped semiconductor;
   (c) forming an optically transparent and electrically conductive dielectric layer directly on a top side of said non-alloy ohmic contact layer;
   (d) forming a first metallic layer above said dielectric layer, *wherein no metal layer is positioned between said first metallic layer and said non-alloy ohmic contact layer*, thereby completing a first layered structure on said top side of said first substrate;
   (e) providing a second layered structure comprising a second substrate; and
   (f) wafer-bonding a top side of said second layered structure to a top side of said first layered structure.

16. The method as claimed in claim 1, wherein said second layered structure further comprises an [insulation] *insulating* layer on a top side of said second substrate.

20. [The] *A* method [as claimed in claim 1, wherein said second substrate is a non-electrically conductive substrate] *for fabricating a light emitting diode structure, comprising the steps of:*
   *(a) forming a light generating structure on a top side of a first substrate;*
   *(b) forming a non-alloy ohmic contact layer on a top side of said light generating structure, said non-alloy ohmic contact layer being a doped semiconductor;*
   *(c) forming an optically transparent and electrically conductive dielectric layer directly on a top side of said non-alloy ohmic contact layer;*
   *(d) forming a first metallic layer above said dielectric layer, thereby completing a first layered structure on said top side of said first substrate;*
   *(e) providing a second layered structure comprising a non-electrically conductive second substrate; and*
   *(f) wafer-bonding a top side of said second layered structure to a top side of said first layered structure.*

*25. A method for fabricating a light emitting diode structure, comprising the steps of:*
   *(a) forming a light generating structure on a top side of a first substrate;*
   *(b) forming a non-alloy ohmic contact layer on a top side of said light generating structure, said non-alloy ohmic contact layer being a doped semiconductor;*
   *(c) forming an optically transparent and electrically conductive dielectric layer directly on a top side of said non-alloy ohmic contact layer;*
   *(d) forming a first metallic layer above said dielectric layer, thereby completing a first layered structure on said top side of said first substrate;*
   *(e) providing a second layered structure comprising a second substrate and an insulation layer on a top side of said second substrate; and*
   *(f) wafer-bonding a top side of said second layered structure to a top side of said first layered structure.*

*26. The method as claimed in claim 25, wherein said insulating layer is made of one of the following materials: $SiN_x$ and $SiO_x$.*

*27. A method for fabricating a light emitting diode structure, comprising the steps of:*
   *(a) forming a light generating structure on a top side of a first substrate;*
   *(b) forming a non-alloy ohmic contact layer on a top side of said light generating structure, said non-alloy ohmic contact layer being a doped semiconductor;*
   *(c) forming an optically transparent and electrically conductive dielectric layer directly on a top side of said non-alloy ohmic contact layer;*
   *(d) forming a first metallic layer above said dielectric layer, wherein said optically transparent and electrically conductive dielectric layer is the only layer between said first metallic layer and said non-alloy ohmic contact layer, thereby completing a first layered structure on said top side of said first substrate;*
   *(e) providing a second layered structure comprising a second substrate; and*
   *(f) wafer-bonding a top side of said second layered structure to a top side of said first layered structure.*

*28. A method for fabricating a light emitting diode structure, comprising the steps of:*
   *(a) forming a light generating structure on a top side of a first substrate;*
   *(b) forming a non-alloy ohmic contact layer on a top side of said light generating structure, said non-alloy ohmic contact layer being a doped semiconductor;*
   *(c) forming an optically transparent and electrically conductive dielectric layer directly on a top side of said non-alloy ohmic contact layer, wherein no metal-containing grid or channels are provided within said optically transparent and electrically conductive dielectric layer and said non-alloy ohmic contact layer;*
   *(d) forming a first metallic layer above said dielectric layer, thereby completing a first layered structure on said top side of said first substrate;*
   *(e) providing a second layered structure comprising a second substrate; and*
   *(f) wafer-bonding a top side of said second layered structure to a top side of said first layered structure.*

*29. A method for fabricating a light emitting diode structure, comprising the steps of:*

(a) forming a light generating structure on a top side of a first substrate;

(b) forming a non-alloy ohmic contact layer on a top side of said light generating structure, said non-alloy ohmic contact layer being a doped semiconductor;

(c) forming an optically transparent and electrically conductive dielectric layer directly on a top side of said non-alloy ohmic contact layer;

(d) forming a first metallic layer above said dielectric layer, wherein no metal layer is positioned between said non-alloy ohmic contact layer and said dielectric layer, thereby completing a first layered structure on said top side of said first substrate;

(e) providing a second layered structure comprising a second substrate; and (f) wafer-bonding a top side of said second layered structure to a top side of said first layered structure.

* * * * *